United States Patent
Liu et al.

(10) Patent No.: US 12,230,342 B2
(45) Date of Patent: Feb. 18, 2025

(54) MEMORY DEVICE, MEMORY SYSTEM, AND READ OPERATION METHOD THEREOF

(71) Applicant: YANGTZE MEMORY TECHNOLOGIES CO., LTD., Wuhan (CN)

(72) Inventors: Hongtao Liu, Wuhan (CN); Lei Jin, Wuhan (CN); Xiangnan Zhao, Wuhan (CN); Ying Huang, Wuhan (CN); Lei Guan, Wuhan (CN); Yuanyuan Min, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 139 days.

(21) Appl. No.: 17/871,422

(22) Filed: Jul. 22, 2022

(65) Prior Publication Data
US 2023/0178160 A1 Jun. 8, 2023

Related U.S. Application Data

(63) Continuation of application No. PCT/CN2022/104305, filed on Jul. 7, 2022.

(30) Foreign Application Priority Data

Dec. 2, 2021 (CN) .......................... 202111459999.2

(51) Int. Cl.
*G11C 16/06* (2006.01)
*G11C 11/4074* (2006.01)
(Continued)

(52) U.S. Cl.
CPC ........ *G11C 29/022* (2013.01); *G11C 11/4074* (2013.01); *G11C 11/4085* (2013.01); *G11C 29/52* (2013.01)

(58) Field of Classification Search
CPC .............. G11C 29/022; G11C 11/4074; G11C 11/4085; G11C 29/52; G11C 16/0483;
(Continued)

(56) References Cited

U.S. PATENT DOCUMENTS 10,541,037 B2 * 1/2020 Zhao ...................... H10B 41/27
11,727,995 B2 * 8/2023 Nakazawa ............ H01L 23/481
365/189.011
(Continued)

FOREIGN PATENT DOCUMENTS

CN 107665721 A 2/2018
CN 109493895 A 3/2019
(Continued)

OTHER PUBLICATIONS

International Search Report issued in corresponding International Application No. PCT/CN2022/104305, mailed Sep. 30, 2022, 4 pages.

*Primary Examiner* — Tha-O H Bui
(74) *Attorney, Agent, or Firm* — BAYES PLLC

(57) ABSTRACT

Upon determining that a first read operation on one memory cell of a plurality of memory cells has failed, a second read operation on the memory cell is started. In the second read operation, a second pass voltage is applied to first unselected word lines, and a first pass voltage is applied to second unselected word lines. The first unselected word lines include one or more word lines adjacent to a selected word line, and the second unselected word lines include remaining unselected word lines. The selected word line corresponds to the memory cell to be read. The first pass voltage includes a voltage applied to the first unselected word lines in the first read operation. The second pass voltage is higher than the first pass voltage.

20 Claims, 12 Drawing Sheets

(51) Int. Cl.
*G11C 11/408* (2006.01)
*G11C 29/02* (2006.01)
*G11C 29/52* (2006.01)

(58) Field of Classification Search
CPC ..... G11C 16/26; G11C 16/3427; G11C 16/08; G11C 29/021; G11C 29/028; G11C 2029/1202; G06F 3/0658
USPC .................................................. 365/185.09
See application file for complete search history.

(56) References Cited

U.S. PATENT DOCUMENTS

| | | | |
|---|---|---|---|
| 2005/0213385 A1* | 9/2005 | Hosono | G11C 16/08 365/185.17 |
| 2010/0124119 A1* | 5/2010 | Lee | G11C 11/5642 365/185.09 |
| 2015/0325304 A1 | 11/2015 | Kim et al. | |
| 2020/0124119 A1 | 5/2020 | Lee et al. | |
| 2020/0143895 A1* | 5/2020 | Futatsuyama | G11C 16/26 |

FOREIGN PATENT DOCUMENTS

| | | |
|---|---|---|
| CN | 114420185 A | 4/2022 |
| KR | 101490426 B1 | 2/2015 |

\* cited by examiner

MEMORY DEVICE, MEMORY SYSTEM, AND READ OPERATION METHOD THEREOF

CROSS-REFERENCE TO RELATED APPLICATIONS

This application is a continuation of Internal Application No. PCT/CN2022/104305, filed Jul. 7, 2022, entitled "MEMORY DEVICE, MEMORY SYSTEM, AND READ OPERATION METHOD THEREOF," which claims the benefit of priority to Chinese Application No. 202111459999.2, filed on Dec. 2, 2021, both of which are incorporated herein by reference in their entireties.

BACKGROUND

The present disclosure relates to memory devices, memory systems, and read operation methods thereof.

As technology advances, high-density memory cells have been incorporated into semiconductor memory devices to reduce overall device sizes and increase data storage capabilities. The increase in integration density, however, may also lead to an increase in coupling between memory cells, and due to the coupling, failure may easily occur when reading a selected memory cell. This issue is known as "reading disturbances."

SUMMARY

In one aspect of the present disclosure, a memory device that may include a plurality of memory cells and peripheral circuits coupled to the plurality of memory cells is provided. The peripheral circuits may be configured to upon determining that a first read operation on one memory cell of the plurality of memory cells has failed, start a second read operation on the memory cell. In the second read operation, the peripheral circuits may be configured to apply a second pass voltage to first unselected word lines and a first pass voltage to second unselected word lines. The first unselected word lines may include one or more word lines adjacent to a selected word line, and the second unselected word lines may include remaining unselected word lines. The selected word line may correspond to the memory cell to be read. The first pass voltage may include a voltage applied to the first unselected word lines in the first read operation. The second pass voltage may be higher than the first pass voltage.

In some implementations, in the first read operation, the peripheral circuits may be configured to apply the first pass voltage to the first unselected word lines and the second unselected word lines.

In some implementations, the peripheral circuits may be further configured to in the second read operation, apply a second read voltage to the selected word line. The second read voltage may be different from a first read voltage that was applied to the selected word line in the first read operation.

In some implementations, the peripheral circuits may be further configured to upon determining that the second read operation has failed, start a third read operation on the memory cell. In the third read operation, the peripheral circuits may be configured to apply a third pass voltage to the first unselected word lines and the first pass voltage to the second unselected word lines. The third pass voltage may be higher than the second pass voltage.

In some implementations, the peripheral circuits may be further configured to upon determining that an $N^{th}$ read operation has failed, start an $N+1^{th}$ read operation on the memory cell. N may be a positive integer and greater than 2. In the $N+1^{th}$ read operation, the peripheral circuits may be configured to apply an $N+1^{th}$ pass voltage to the first unselected word lines and the first pass voltage to the second unselected word lines. An $N^{th}$ pass voltage was applied to the first unselected word lines in the $N^{th}$ read operation. The $N+1^{th}$ pass voltage may be higher than each of the $N^{th}$ pass voltage, the first pass voltage, and the second pass voltage.

In some implementations, the peripheral circuits may be further configured to upon determining that the second read operation has failed, start a third read operation on the memory cell. In the third read operation, the peripheral circuits may be configured to apply a third read voltage to the selected word line. The third read voltage may be different from each of the first read voltage and the second read voltage.

In some implementations, the peripheral circuits may be further configured to upon determining that the second read operation has failed, start a third read operation on the memory cell. In the third read operation, the peripheral circuits may be configured to apply the second pass voltage to the first unselected word lines, the first pass voltage to the second unselected word lines, a third read voltage to the selected word line. The third read voltage may be different from each of the first read voltage and the second read voltage.

In some implementations, the peripheral circuits may be further configured to in response to an error bit count of the first read operation being greater than or equal to a threshold number, determine that the first read operation has failed.

In some implementations, the selected word line may include a selected word line $WL_n$, and the first unselected word lines may include unselected word lines $WL_{n+1}$ and $WL_{n-1}$ adjacent to the selected word line $WL_n$. N may include an integer.

In some implementations, the peripheral circuits may be further configured to perform at least one of querying a first voltage configuration table to retrieve a pass voltage corresponding to a number of applied read operations, or querying a second voltage configuration table to retrieve a read voltage corresponding to the number of applied read operations. The first voltage configuration table may be configured to store a first corresponding relation between multiple pass voltages and numbers of applied read operations, and the pass voltage may be applied to the first unselected word lines. The second voltage configuration table may be configured to store a second corresponding relation between multiple read voltages and the numbers of applied read operations, and the read voltage may be applied to the selected word line.

In some implementations, the peripheral circuits may include a control logic, a voltage generator, and a word line driver. The control logic may be configured to generate a command signal upon determining that the first read operation on the memory cell has failed. The voltage generator may be configured to generate the first pass voltage and the second pass voltage, in response to the command signal. The word line driver may be configured to apply the second pass voltage to the first unselected word lines and the first pass voltage to the second unselected word lines.

In some implementations, the memory device may be a three-dimensional (3D) NAND memory device.

In another aspect of the present disclosure, a memory system is provided. The memory system may include one or more memory devices and a memory controller coupled to the one or more memory devices and configured to generate a read instruction signal on one of the one or more memory devices. Each of the one or more memory devices may include a plurality of memory cells and peripheral circuits coupled to the plurality of memory cells. Upon receipt of the read instruction signal from the memory controller, the peripheral circuits of a corresponding memory device may be configured to upon determining that a first read operation on one memory cell of the plurality of memory cells has failed, start a second read operation on the memory cell. In the second read operation, the peripheral circuits may be configured to apply a second pass voltage to first unselected word lines and a first pass voltage to second unselected word lines. The first unselected word lines may include one or more word lines adjacent to a selected word line, and the second unselected word lines may include remaining unselected word lines. The selected word line may correspond to the memory cell to be read. The first pass voltage may include a voltage applied to the first unselected word lines in the first read operation, and the second pass voltage may be higher than the first pass voltage.

In some implementations, in the first read operation, the peripheral circuits may be configured to apply the first pass voltage to the first unselected word lines and to the second unselected word lines.

In some implementations, the peripheral circuits may be further configured to upon determining that an $N^{th}$ read operation has failed, start an $N+1^{th}$ read operation on the memory cell. N may be a positive integer and greater than 0. In the $N+1^{th}$ read operation, the peripheral circuits may be configured to apply an $N+1^{th}$ pass voltage to the first unselected word lines and the first pass voltage to the second unselected word lines. An $N^{th}$ pass voltage was applied to the first unselected word lines in the $N^{th}$ read operation. The $N+1^{th}$ pass voltage may be higher than the $N^{th}$ pass voltage.

In some implementations, the peripheral circuits may be further configured to upon determining that the second read operation has failed, start a third read operation on the memory cell. In the third read operation, the peripheral circuits may be configured to apply a third read voltage to the selected word line. The third read voltage may be different from a first read voltage and a second read voltage. The first read voltage may include a first voltage applied to the selected word line in the first read operation, and the second read voltage may include a second voltage applied to the selected word line in the second read operation.

In some implementations, the peripheral circuits may be further configured to in response to an error bit count of the first read operation being greater than or equal to a threshold number, determine that the first read operation has failed.

In some implementations, the selected word line may include a selected word line $WL_n$, and the first unselected word lines may include unselected word lines $WL_{n+1}$ and $WL_{n-1}$ adjacent to the selected word line $WL_n$. N may include an integer.

In some implementations, the peripheral circuits may be further configured to perform at least one of querying a first voltage configuration table to retrieve a pass voltage corresponding to a number of applied read operations, or querying a second voltage configuration table to retrieve a read voltage corresponding to the number of applied read operations. The first voltage configuration table may be configured to store a first corresponding relation between multiple pass voltages and numbers of applied read operations, and the pass voltage may be applied to the first unselected word lines. The second voltage configuration table may be configured to store a second corresponding relation between multiple read voltages and the numbers of applied read operations, and the read voltage may be applied to the selected word line.

In some implementations, the peripheral circuits may include a control logic, a voltage generator, and a word line driver. The control logic may be configured to generate a command signal upon determining that the first read operation on the memory cell has failed. The voltage generator may be configured to generate the first pass voltage and the second pass voltage, in response to the command signal. The word line driver may be configured to apply the second pass voltage to the first unselected word lines and the first pass voltage to the second unselected word lines.

In some implementations, the memory system may further include a host configured to send commands to the memory controller for generating the read instruction signal and to receive read data from the memory device.

In some implementations, the memory device may be a three-dimensional (3D) NAND memory device.

In still another aspect of the present disclosure, a method for read operations performed on a memory device that may include a plurality of memory cells is provided. The method may include upon determining that a first read operation on one memory cell of the plurality of memory cells has failed, starting a second read operation on the memory cell. In the second read operation, a second pass voltage may be applied to first unselected word lines and a first pass voltage may be applied to second unselected word lines. The first unselected word lines may include one or more word lines adjacent to a selected word line, and the second unselected word lines may include remaining unselected word lines. The selected word line may correspond to the memory cell to be read. The first pass voltage may include a voltage applied to the first unselected word lines in the first read operation, and the second pass voltage may be higher than the first pass voltage.

In some implementations, the first pass voltage may be applied to the first unselected word lines and the second unselected word lines in the first read operation.

In some implementations, in the second read operation, a second read voltage may be applied to the selected word line. The second read voltage may be different from a first read voltage that was applied to the selected word line in the first read operation.

In some implementations, upon determining that the second read operation has failed, a third read operation on the memory cell may be started. In the third read operation, a third pass voltage may be applied to the first unselected word lines, and the first pass voltage may be applied to the second unselected word lines. The third pass voltage may be higher than each of the first pass voltage and the second pass voltage.

In some implementations, upon determining that an $N^{th}$ read operation has failed, an $N+1^{th}$ read operation on the memory cell may be started. N may be a positive integer and greater than 2. In the $N+1^{th}$ read operation, an $N+1^{th}$ pass voltage may be applied to the first unselected word lines, and the first pass voltage may be applied to the second unselected word lines. An $N^{th}$ pass voltage was applied to the first unselected word lines in the $N^{th}$ read operation. The $N+1^{th}$ pass voltage may be higher than each of the $N^{th}$ pass voltage, the first pass voltage, and the second pass voltage.

In some implementations, upon determining that the second read operation has failed, a third read operation on the memory cell may be started. In the third read operation, a third read voltage may be applied to the selected word lines. The third read voltage may be different from each of the first read voltage and the second read voltage.

In some implementations, upon determining that the second read operation has failed, a third read operation on the memory cell may be started. In the third read operation, the second pass voltage may be applied to the first unselected word lines, the first pass voltage may be applied to the second unselected word lines, and a third read voltage may be applied to the selected word line. The third read voltage may be different from each of the first read voltage and the second read voltage.

In some implementations, in response to an error bit count of the first read operation being greater than or equal to a threshold number, it may be determined that the first read operation has failed.

In some implementations, the selected word line may include a selected word line $WL_n$, and the first unselected word lines may include unselected word lines $WL_{n+1}$ and $WL_{n-1}$ adjacent to the selected word line $WL_n$. N may include an integer.

In some implementations, the peripheral circuits may be further configured to perform at least one of querying a first voltage configuration table to retrieve a pass voltage corresponding to a number of applied read operations, or querying a second voltage configuration table to retrieve a read voltage corresponding to the number of applied read operations. The first voltage configuration table may be configured to store a first corresponding relation between multiple pass voltages and numbers of applied read operations, and the pass voltage may be applied to the first unselected word lines. The second voltage configuration table may be configured to store a second corresponding relation between multiple read voltages and the numbers of applied read operations, and the read voltage may be applied to the selected word line.

In some implementations, a command signal may be generated upon determining that the first read operation has failed. The first pass voltage and the second pass voltage may be generated in response to the command signal. The second pass voltage may be applied to the first unselected word lines, and the first pass voltage may be applied to the second unselected word lines.

In some implementations, the memory device may be a three-dimensional (3D) NAND memory device.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
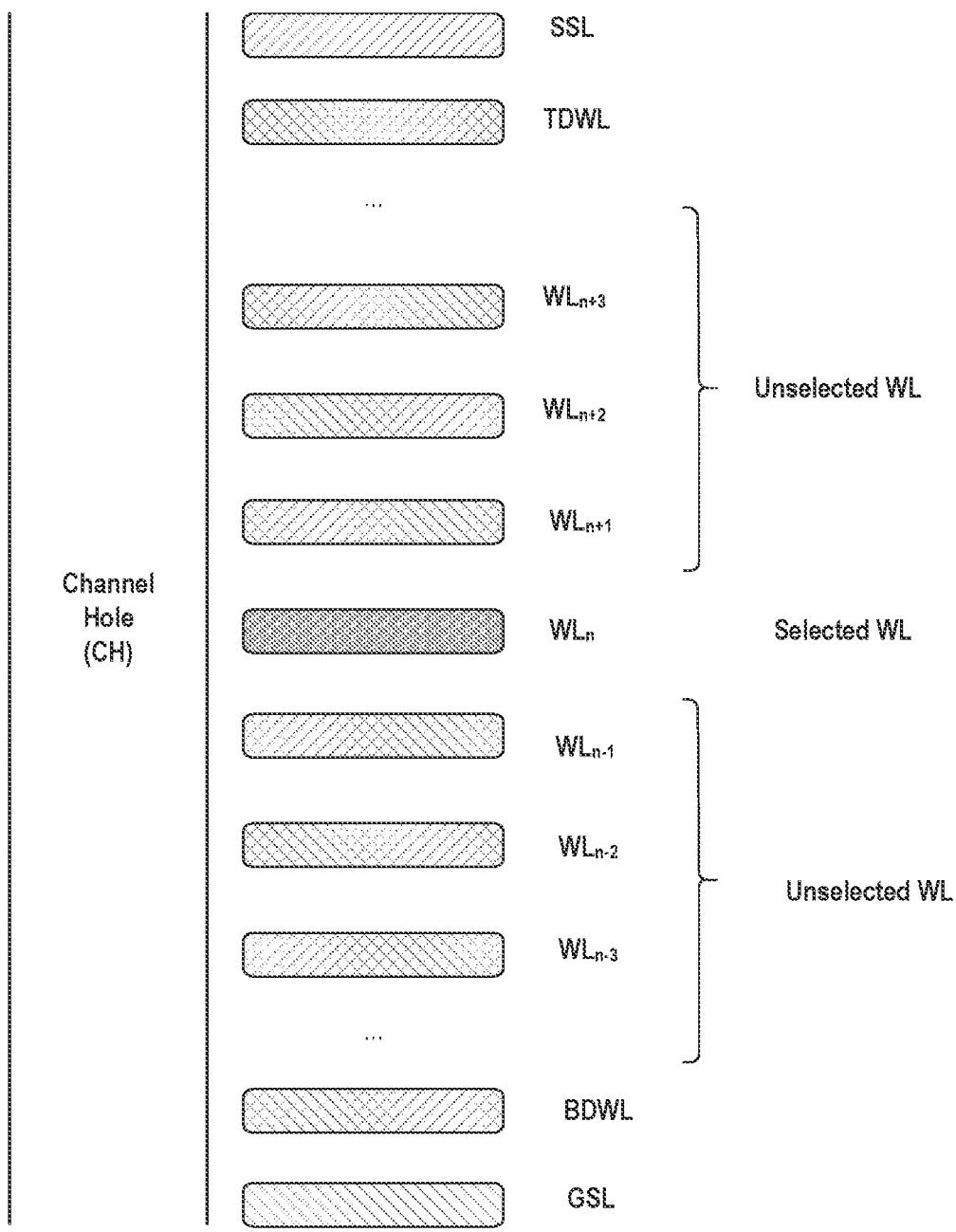
FIG. 1 illustrates a schematic diagram of a NAND memory device in part.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, again, depending at least in part on the context. In addition, the term "couple," "coupled to," or "coupled between" may be understood as not necessarily intended to be "physically joined or attached," i.e., direct attachment, but can also be interpreted by indirect connection through an intermediate component.

Further, the terms "vertical" and "horizontal" may be only used for ease of description. These directions may be relative to a pre-defined coordinate system or a specific direction (e.g., a layout of a drawing). It can be understood that these directions are not absolute and are only provided for reference.

Non-volatile memory products that consume less power, have lightweight, and produce reliable performance, such as three-dimensional (3D) NAND memory devices, are widely used in the related fields. As the memory cells are continuously sized down, however, the issue of "read disturbances" becomes more significant and accounts for the factor that degrades the reliability of a memory device. As noticed, a read operation on one row of memory cells may impact the threshold voltages of unread memory cells in different rows of the same block. As a result, such disturbances may shift the threshold voltages of these unread memory cells and eventually cause digital values of these nearby memory cells to be changed to different logic states, leading to reading errors.

FIG. 1 illustrates a schematic diagram of a NAND memory device in part. For simplicity of the description, FIG. 1 only shows a portion of the NAND memory device. As shown in FIG. 1, memory cell array 100 may include a string selection line SSL, a plurality of word lines WLs, and a ground selection line GSL, where the plurality of word lines may include a top dummy word line TDWL, a bottom dummy word line BDWL, and main word lines including a selected word line and unselected word lines. These word lines are numbered with respect to the selected word line for ease of description. Although not shown, in some instances, the NAND memory device may also include one or more intermediate dummy word lines between the main word lines, such as inter-deck plug (IDP) dummy word lines. In other implementations not shown in FIG. 1, the plurality of word lines may include a plurality of top dummy word lines TDWLs, a plurality of bottom dummy word lines BDWLs, main word lines, and a plurality of intermediate dummy word lines between the main word lines. It can also be understood that memory cell array 100 may also include other electrical lines, not shown in FIG. 1, configured to couple at least a portion of memory cells, such as a source line.

Figure 2:
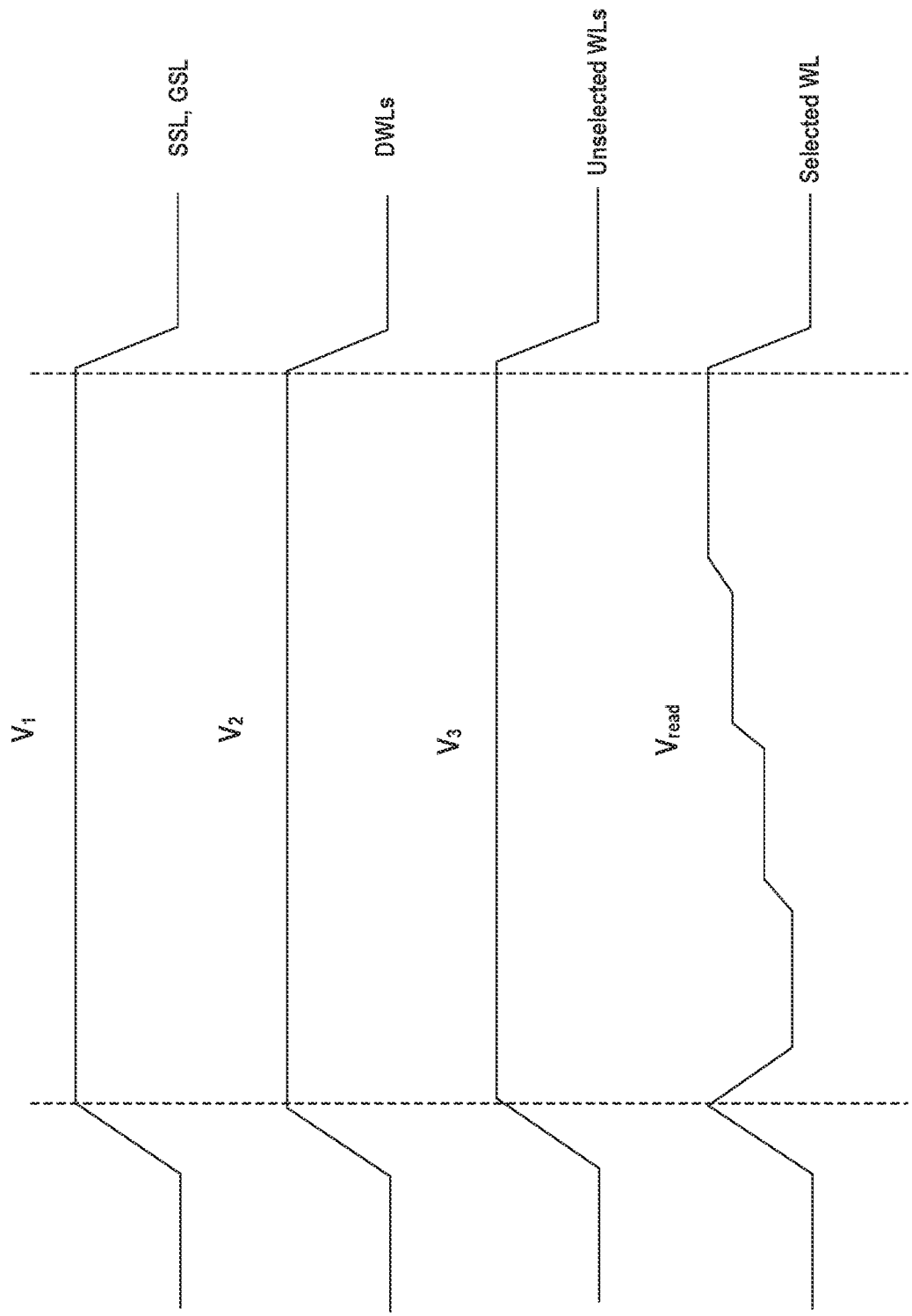
FIG. 2 illustrates a schematic diagram showing an exemplary voltage scheme in a read operation based on the NAND memory device in FIG. 1.

FIG. 2 illustrates a schematic diagram showing an exemplary voltage scheme in a read operation based on the NAND memory device in FIG. 1. In the read operation, as shown in FIG. 2, a first voltage $V_1$ may be applied to string selection line SSL and ground selection line GSL. A second voltage $V_2$ may be applied to dummy world lines DWLs, and a third voltage $V_3$ may be applied to the unselected word lines. To perform the read operation, a read voltage $V_{read}$ may be applied to the selected word line corresponding to a memory cell to be read. Each of the first, second, and third voltages may be a turn-on voltage (higher than a threshold voltage; or termed "pass voltages $V_{pass}$") of a memory cell in memory cell array 100. In some instances, these voltages may be identical, i.e., $V_1=V_2=V_3=V_{pass}$. Further, pass voltage $V_{pass}$ applied to a word line may be higher than the maximal threshold voltage of memory cells in the same word line, while read voltage $V_{read}$ may be lower than pass voltage $V_{pass}$.

Figure 3:
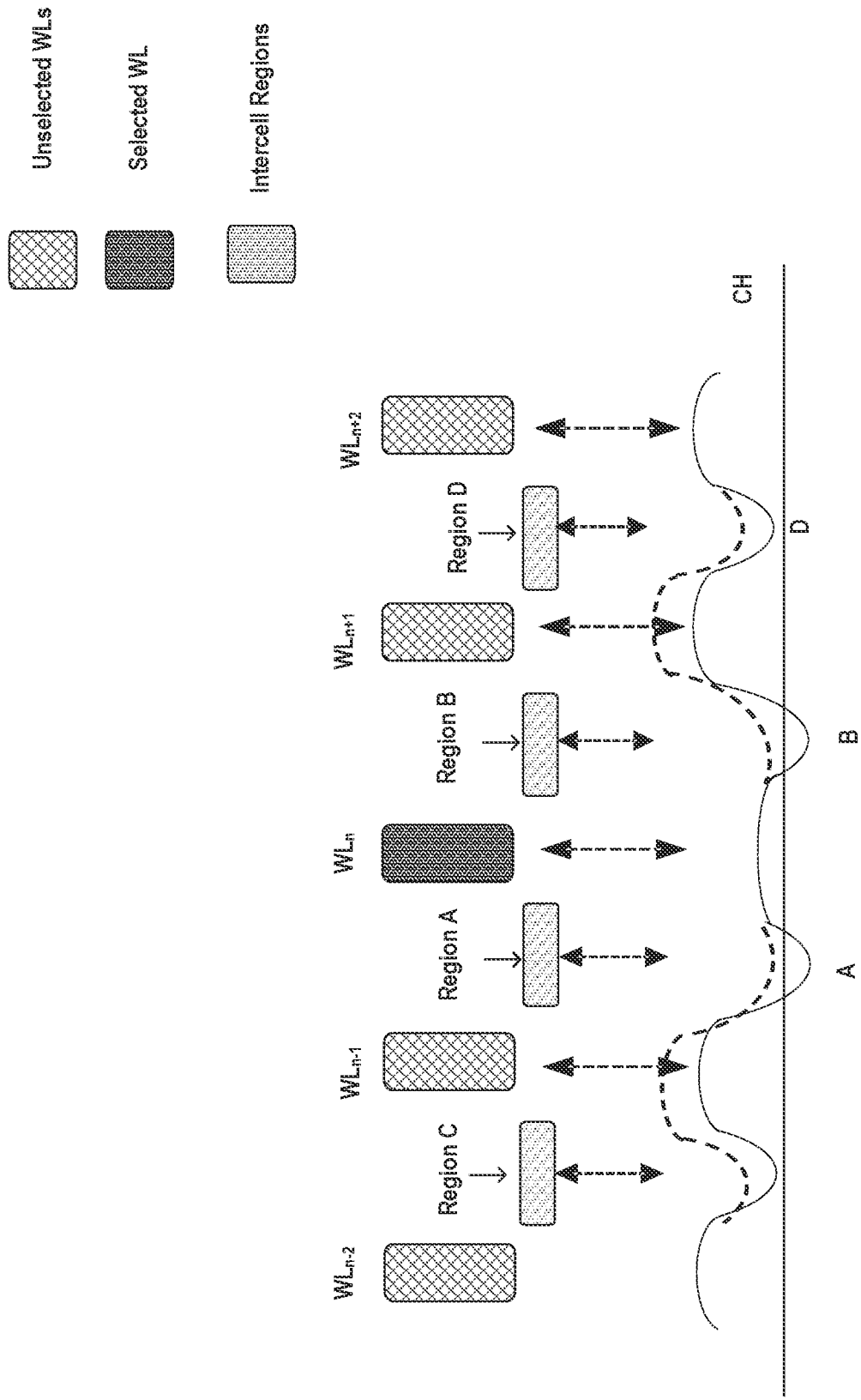
FIG. 3 illustrates a schematic diagram showing channel potentials corresponding to a channel hole (CH) during a read operation.

FIG. 3 illustrates a schematic diagram showing channel potentials corresponding to a channel hole (CH) during a read operation. By applying the pass voltage (or termed "tun-on voltage") to the unselected word lines and applying the read voltage to the selected word line, the channel potentials in the channel region, corresponding to the selected word line, are properly reversed, as shown in FIG. 3. Due to read voltage $V_{read}$ being lower than pass voltage $V_{pass}$, however, the channel potentials corresponding to the two intercell regions (e.g., regions A and B) adjacent to the selected word line $WL_n$ are smaller than channel potentials corresponding to other intercell regions (e.g., regions C and D), as depicted by a solid curve line in FIG. 3, where n in $WL_n$ is an index and includes an integer, such as −2, −1, 0, 1, and 2. Consequently, more reading disturbances in the read operations may occur because of the lower channel potentials in the intercell regions adjacent to the selected word line, e.g., in regions A and B.

In view of the reading disturbance issues, the present disclosure provides various read operation schemes to be applied to a memory device or a memory system during read operations. Accordingly, the low channel potentials corresponding to the two intercell regions adjacent to the selected word line can be enhanced, the threshold voltage shift can be reduced, and the read error rate can be improved.

Figure 4:
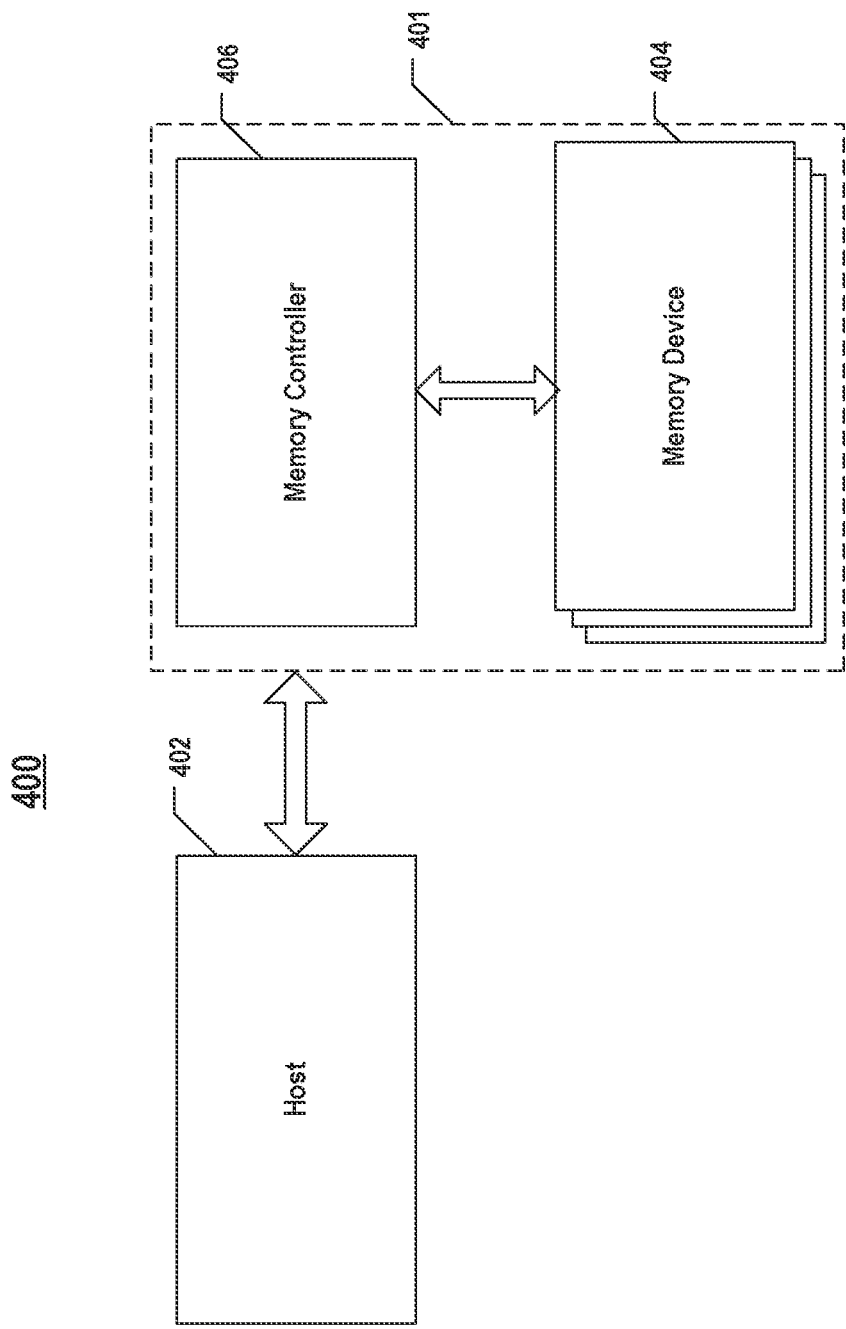
FIG. 4 illustrates a block diagram of an exemplary memory system having a storage system, according to some implementations of the present disclosure.

FIG. 4 illustrates a block diagram of an exemplary memory system 400 having a storage system 401, according to some implementations of the present disclosure. Memory system 400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 4, memory system 400 can include a host 402 and storage system 401 having one or more memory devices 404 and a memory controller 406. Host 402 can be a processor of an electronic device, such as a central processing unit (CPU), or a system-on-chip (SoC), such as an application processor (AP). In some implementations, host 402 can be configured to send or receive data to or from memory devices 404. In some implementations, host 402 can be a user logic, or a user interface such that the user may give instructions to the host and transmit the instructions to the memory devices or the memory array.

Memory device 404 can be any memory device disclosed in the present disclosure. As disclosed below in detail, memory device 404, such as NAND Flash memory device, or dynamic random access memory (DRAM), phase-change random access memory (PCRAM) can include a clock input, a command bus, a data bus, a control logic, an address register, a row decoder/word line driver, a memory cell array having memory cells, a voltage generator, a page buffer/ sense amplifier, a column decoder/bit line driver, a data input/output (I/O), according to some implementations.

Memory controller 406 may be coupled to memory device 404 and host 402 and may be configured to control memory device 404, according to some implementations. Memory controller 406 can manage the data stored in memory device 404 and communicate with host 402. In some implementations, memory controller 406 may be designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 406 may be designed for operating in a high duty-cycle environment solid-state drives (SSDs) or embedded multi-media-cards (eMMCs) used as data storage for mobile devices, such as smartphones, tablets, laptop computers, etc., and enterprise storage arrays. Memory controller 406 can be configured to control operations of memory device 404, such as read, erase, and write operations. Memory controller 406 can also be configured to manage various functions with respect to the data stored or to be stored in memory device 404 including, but not limited to bad-block management, garbage collection, logical-to-physical address conversion, wear leveling, etc. In some implementations, memory controller 406 may be further configured to process error correction codes (ECCs) with respect to the data read from or written to memory device 404. Memory controller 406 may perform any other suitable functions as well, for example, formatting memory device 404. Memory controller 406 can communicate with an external device (e.g., host 402) according to a particular communication protocol. For example, memory controller 406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc. Furthermore, memory controller 406 can also be configured to receive a command from, transmit data to host 402, and perform multiple functions according to some implementations of the present disclosure.

Figure 5A:
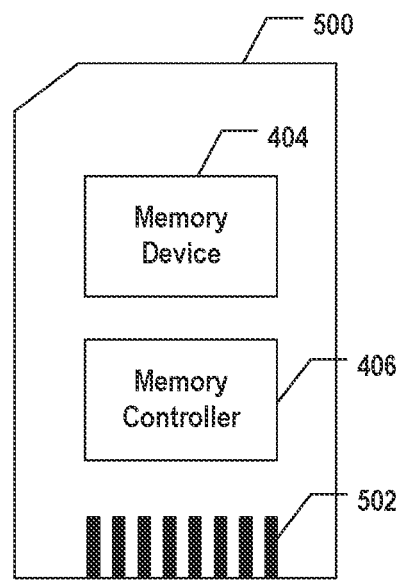
FIG. 5A illustrates a diagram of an exemplary memory card having a memory device, according to some implementations of the present disclosure.
Figure 5B:
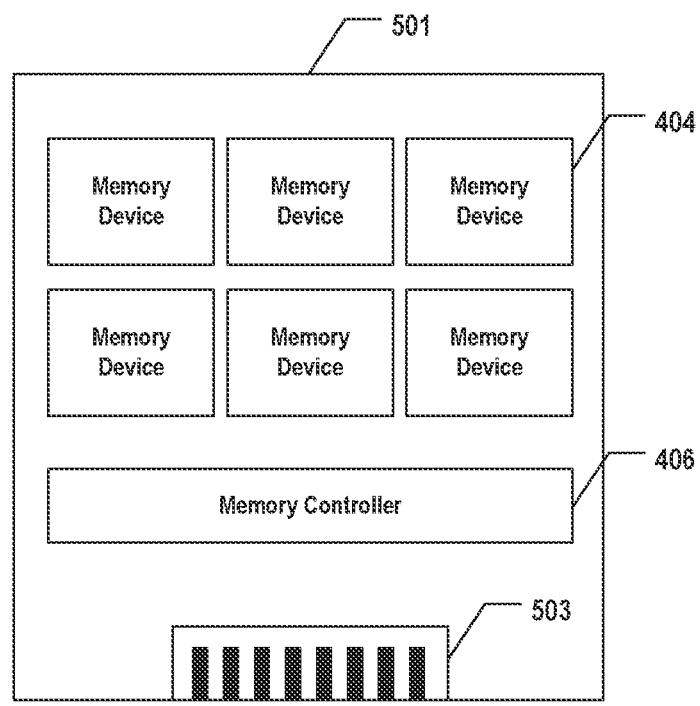
FIG. 5B illustrates a diagram of an exemplary solid-state drive (SSD) having a plurality of memory devices, according to some implementations of the present disclosure.

Memory controller 406 and one or more memory devices 404 can be integrated into various types of storage devices, for example, being included in the same package, such as a universal Flash storage (UFS) package or an eMMC package. That is, memory system 400 can be implemented and packaged into different types of end electronic products. In one example as shown in FIG. 5A, memory controller 406 and a single memory device 404 may be integrated into a memory card 500. Memory card 500 can include a PC card (personal computer memory card international association, PCMCIA), a CF card, a smart media (SM) card, a memory stick, a multimedia card (MMC, RS-MMC, MMCmicro), an SD card (SD, miniSD, microSD, SDHC), a UFS, etc. Memory card 500 can further include a memory card connector 502 coupling memory card 500 with a host (e.g., host 402 in FIG. 4). In another example as shown in FIG. 5B, memory controller 406, and multiple memory devices 404 may be integrated into an SSD 501. SSD 501 can further include an SSD connector 503 coupling SSD 501 with a host (e.g., host 402 in FIG. 4). In some implementations, the storage capacity and/or the operation speed of SSD 501 can be greater than those of memory card 500.

Figure 6:
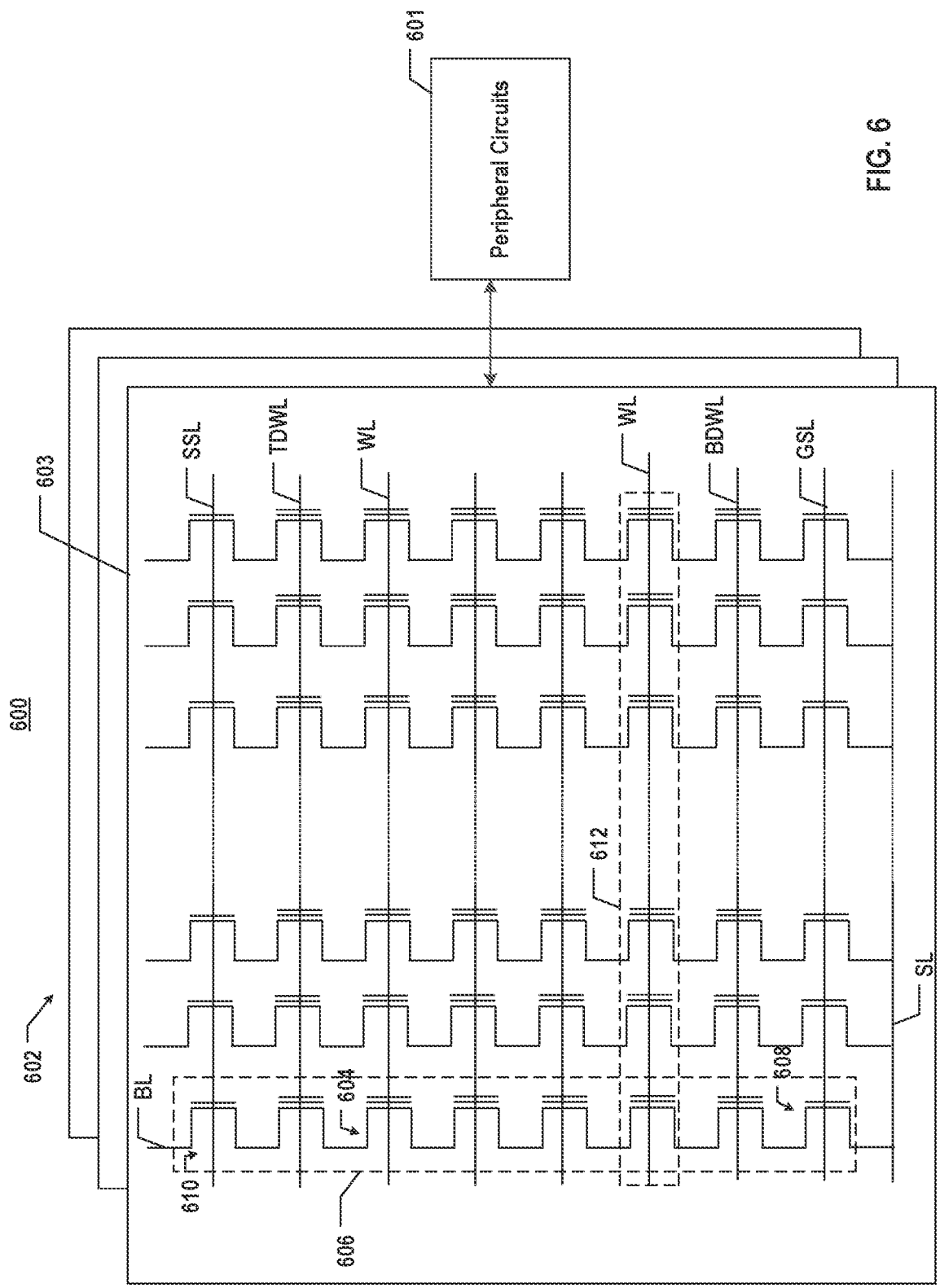
FIG. 6 illustrates a schematic diagram of an exemplary memory device including peripheral circuits and a memory cell array, according to some implementations of the present disclosure.

FIG. 6 illustrates a schematic diagram of an exemplary memory device 600 including peripheral circuits 601 and a memory cell array 602, according to some implementations of the present disclosure. Memory device 600 may include a three-dimensional (3D) NAND memory device, and memory cell array 602 may include a 3D NAND memory cell array. Memory cell array 602 may include one or more blocks 603, such as block 0, block 1, block 2, block 3, . . . , etc. Each block may include a plurality of word lines WLs, bit lines BLs, and memory cells 604 formed between word lines WLs and bit lines BLs, as shown in FIG. 6. In some instances, the word lines WLs may include one or more main word lines WLs, one or more top dummy word lines TDWLs, and one or more bottom dummy word lines BDWLs, as shown in FIG. 6. In other instances, the word lines WLs may further include one or more intermediate dummy word lines between the main word lines. In some implementations, memory cell array 602 can include a three-dimensional (3D) NAND memory cell array.

In some implementations, memory cell array 602 may include a 3D NAND memory cell array. The 3D NAND memory cell array may include a semiconductor substrate, a memory stack that may include interleaved gate layers and dielectric layers above the semiconductor substrate, and a plurality of channel holes (CH) each extending vertically through the memory stack. A memory film may be formed along a sidewall of the channel hole. The memory film may include a barrier layer, tunneling layer, a storage layer, a blocking layer, etc. Each memory cell 604 may be formed in an intersection between the memory film and each gate layer.

As shown in FIG. 6, in some implementations, memory cell array 602 in one block 603 may be provided in the form of an array of memory strings 606, such as NAND memory strings. In some implementations, each of memory strings 606 may extend vertically above a substrate (not shown), and each may include a plurality of memory cells 604 coupled in series and stacked vertically. Each memory cell 604 may retain a continuous, analog value, such as an electrical voltage or an electronic charge, which depends on the number of electrons trapped within a region of memory cell 604. Each memory cell 604 can be either a floating type of memory cell having a floating-gate transistor or a charge-trap type of memory cell having a charge-trap transistor.

In some implementations, each memory cell 604 may be a single-level cell (SLC) that has two possible memory states and thus can store one bit of data. For example, the first memory state "0" may correspond to a first range of voltages, and the second memory state "1" may correspond to a second range of voltages. In some implementations, each memory cell 604 may be a multi-level cell (MLC) that is capable of storing more than a single bit of data in more than four memory states. For example, the MLC can store two bits per cell, three bits per cell (also known as triple-level cell, TLC), or four bits per cell (also known as a quad-level cell, QLC). Each MLC can be programmed to assume a range of possible nominal storage values. In one example, if each MLC stores two bits of data, then the MLC can be programmed to assume one of three possible programming levels from an erased state by writing one of three possible nominal storage values to the memory cell. A fourth nominal storage value can be used for the erased state.

As shown in FIG. 6, each memory string 606 can include a source selection gate (SSG) transistor 608 at a source end and a drain selection gate (DSG) transistor 610 at a drain end. SSG transistor 608 and DSG transistor 610 can be configured to activate selected memory strings 606 (columns of the memory array) during read and program operations. In some implementations, a source of each memory string 606 in the same block 603 may be coupled through one source line SL (i.e., a common SL). In other words, all memory strings 606 in one block may commonly own an array common source (ACS).

As shown in FIG. 6, SSG transistors 608 may be coupled through ground selection line GSL. DSG transistor 610 of each memory string 606 may be coupled, at one terminal, to a respective bit line BL from which data can be read or programmed via an output bus, according to some implementations. In some implementations, through a selection voltage (i.e., the pass voltage; e.g., above the threshold voltage of DSG transistor 610) or deselected by applying a deselection voltage (e.g., 0 V) to a respective DSG transistor 610 through one or more string selection lines SSLs and/or by applying a selection voltage (i.e., the pass voltage; e.g., above the threshold voltage of SSG transistor 608) or a deselection voltage (e.g., 0 V) to a respective SSG transistor 608 through one or more ground selection lines GSLs, a memory string 606 can be selected or deselected.

As described, memory cells 604 can be organized into multiple blocks 603. Each of blocks 603 can have a common source line SL. In some implementations, each block 603 may be the basic data unit for erase operations. That is, all memory cells 604 in the same block 603 can be erased at the same time. To erase memory cells 604 in a selected block, the common source line coupled to the selected block can be biased with an erase voltage ($V_{ers}$), such as a high positive potential (e.g., 20 V or more). It can be understood that, in other implementations, erase operations can be performed at a half-block level, a quarter-block level, or a level that impacts any suitable portion of memory cells 604 in one block.

Memory cells 604 of adjacent memory strings 606 in one block 603 can be coupled through word lines WLs that select which rows of memory cells 604 to be impacted, e.g., at read and program operations. In some implementations, each word line WL may be coupled to memory cells 604 of one page 612 that is the basic data unit for the program and read operations. The size of one page 612 in bits can correspond to the number of memory strings 606 coupled by one word line WL. Each word line WL may include a gate line configured to couple a plurality of control gates (gate electrodes) of each memory cell 604 in a respective page 612.

Figure 7:
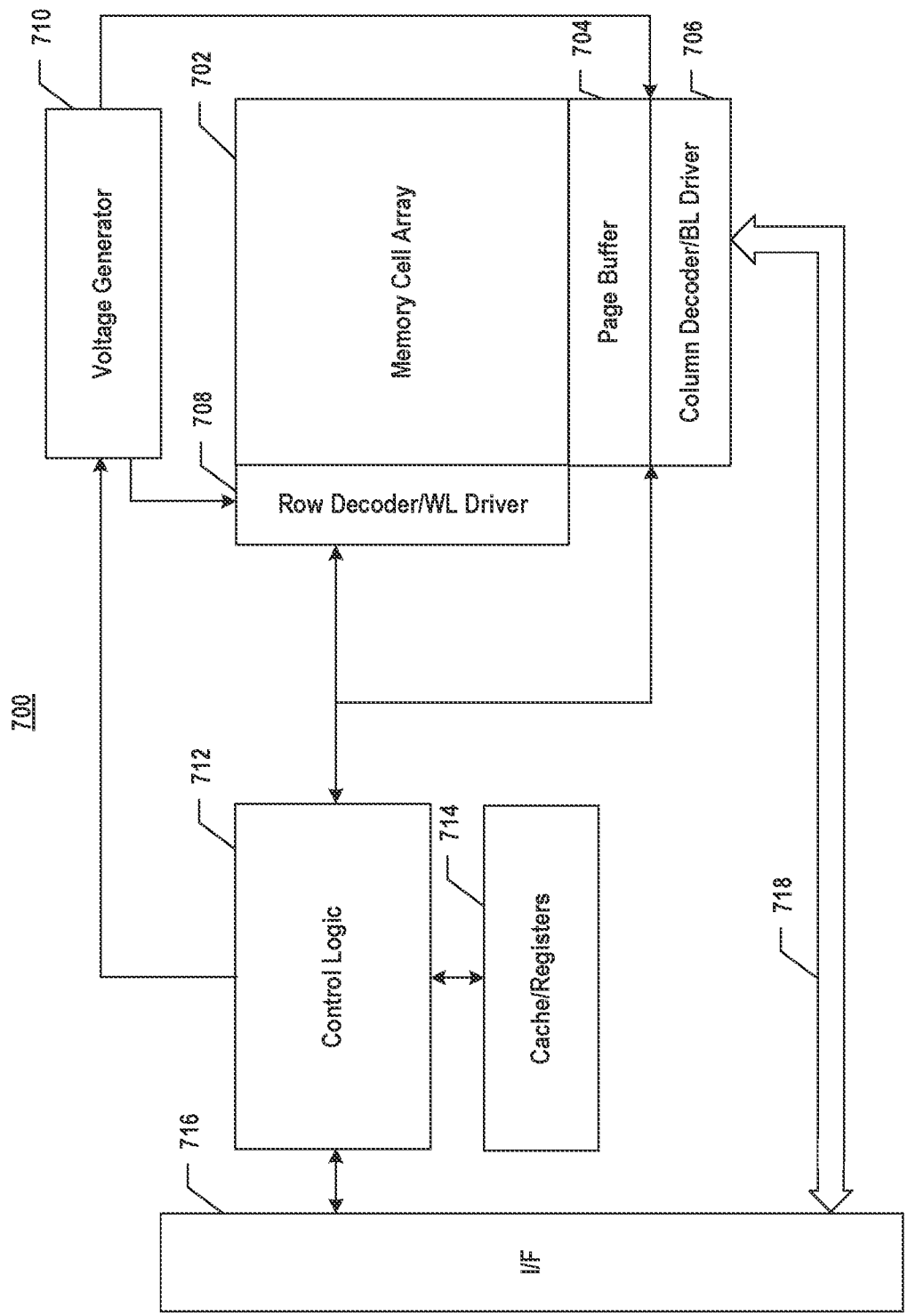
FIG. 7 illustrates a block diagram of an exemplary memory device including a memory cell array and peripheral circuits, according to some implementations of the present disclosure.

FIG. 7 illustrates a block diagram of an exemplary memory device 700 including a memory cell array 702 and peripheral circuits, according to some implementations of the present disclosure. Memory cell array 602 in FIG. 6 can be an example of memory cell array 702 in FIG. 7, while FIG. 7 depicts some examples of peripheral circuits 601 in FIG. 6.

Returning to FIG. 6, peripheral circuits 601 can be coupled to memory cell array 602 through bit lines BLs, word lines WLs, source line SL, string selection line SSL, and ground selection line GSL. Peripheral circuits 601 can include any suitable circuits for facilitating the operations of memory cell array 602 by applying and sensing voltage signals and/or current signals through bit lines BLs to and from each target memory cell 604 through bit lines BLs, word lines WLs, source line SL, string selection line SSL, and ground selection line GSL. Peripheral circuits 601 can include various types of peripheral circuitry formed using CMOS technologies. For example, FIG. 7 illustrates some exemplary peripheral circuits 601, including a page buffer 704, a column decoder/bit line driver 706, a row decoder/word line driver 708, a voltage generator 710, control logic 712, cache/registers 714, an interface (I/F) 716, and a data bus 718. It is understood that in some examples, additional circuits may be included as well, such as a sensing amplifier.

Page buffer 704 can be configured to buffer data read from or programmed to memory cell array 702 according to control signals issued by control logic 712. In one example, page buffer 704 may store one page of program data (write data) to be programmed into one page 612 (shown in FIG. 6) of memory cell array 702. In another example, page buffer 704 may also perform program verification operations to ensure that the data has been properly programmed into memory cells 604 coupled to a selected word line.

Row decoder/word line driver 708 can be configured to be controlled by control logic 712 to select a block 603 of memory cell array 702 and a word line WL of selected block 603. Row decoder/word line driver 708 can be further configured to drive memory cell array 702. For example, row decoder/word line driver 708 may drive memory cells 604 coupled to the selected word line using a voltage generated from voltage generator 710.

Column decoder/bit line driver 706 may be controlled by control logic 712 to select one or more memory strings 606 (shown in FIG. 6) by applying a bit line voltage generated from voltage generator 710. For example, column decoder/ bit line driver 706 may apply column signals for selecting a set of N bits of data from page buffer 704 to be outputted in a read operation.

Control logic 712 can be coupled to each peripheral circuit 601 and configured to control operations of peripheral circuits 601. Cache/registers 714 can be coupled to control logic 712 and may include status registers, command registers, and address registers for storing status information, command operation codes (OP codes), and command addresses for controlling the operations of each peripheral circuit 601.

Interface 716 can be coupled to control logic 712 and configured to interface memory cell array 702 with a memory controller (shown in FIG. 4). In some implementations, interface 716 may act as a control buffer to buffer and relay control commands received from the memory controller and/or a host (shown in FIG. 4) to control logic 712 and status information received from control logic 712 to the memory controller and/or the host. Interface 716 can also be coupled to page buffer 704 and column decoder/bit line driver 706 via data bus 718 and act as an I/O interface and a data buffer to buffer and relay the program data received from the memory controller and/or the host to page buffer 704 and the read data from page buffer 704 to the memory controller and/or the host. In some implementations, interface 716 and data bus 718 can be parts of an I/O circuit of peripheral circuits 601.

Voltage generator 710 may be controlled by control logic 712 to generate word line voltages (e.g., read voltage, program voltage, pass voltage, local voltage, and verification voltage), bit line voltages, and other voltages to be supplied to memory cell array 702. In some implementations, voltage generator 710 can be part of a voltage source that provides voltages at various levels of different peripheral circuits 601 as described below in detail. Consistent with the scope of the present disclosure, in some implementations, the voltages provided by voltage generator 710, for example, to row decoder/word line driver 708, column decoder/bit line driver 706, and page buffer 704 are above certain levels that can be sufficient to perform the memory operations. For example, the voltages provided to the page buffer circuits in page buffer 704 and/or the logic circuits in control logic 712 may be, e.g., between 1.3 V and 5 V, such as 3.3 V, and the voltages provided to the driving circuits in row decoder/word line driver 708 and/or column decoder/bit line driver 706 may be, e.g., between 5 V and 30 V.

As described above with reference to FIG. 3, due to read voltage $\text{\textbackslash}T_{read}$ being lower than pass voltage $V_{pass}$, the channel potentials corresponding to the two intercell regions (e.g., regions A and B) adjacent to the selected word line are smaller than the channel potentials corresponding to the other intercell regions (e.g., regions C and D). In order to address these and other issues, the present disclosure provides inventive voltage schemes, in which various operations strategies are proposed during read operations. In some implementations, a higher pass voltage may apply to the unselected word lines adjacent to the selected word line.

Figure 8:
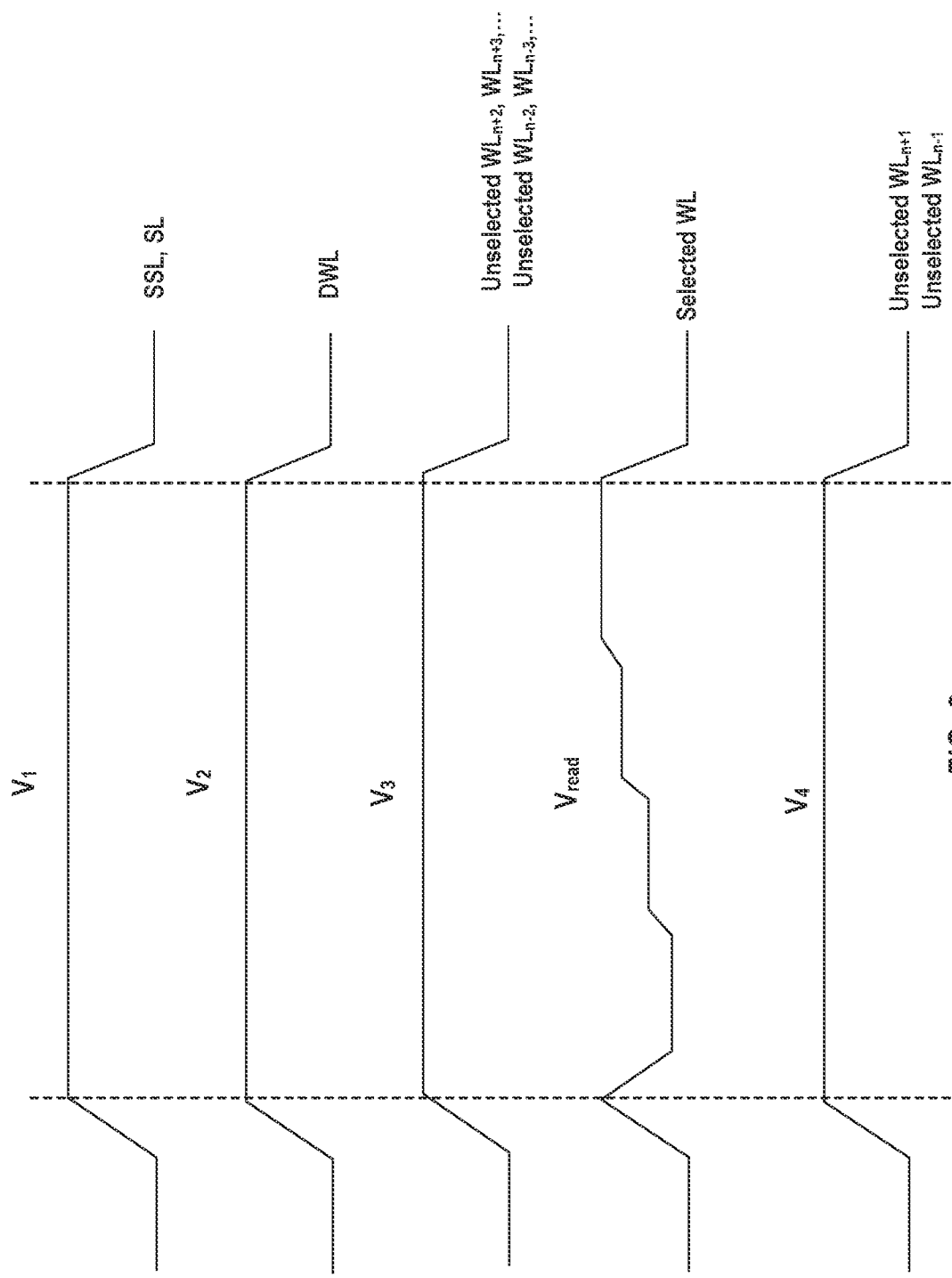
FIG. 8 illustrates a schematic diagram showing another exemplary voltage scheme in a read operation, according to some implementations of the present disclosure.

FIG. 8 illustrates a schematic diagram showing another exemplary voltage scheme in a read operation, according to some implementations of the present disclosure. The memory device can include memory device 600 in FIG. 6, memory device 700 in FIG. 7, or any suitable memory device, such as a 3D NAND memory device. Different from the voltage scheme provided by FIG. 2, a pass voltage $V_4$ may be applied to the unselected word lines (e.g., $WL_{n+1}$ and $WL_{n-1}$) adjacent to the selected word line (e.g., $WL_n$) as shown in FIG. 8. In some implementations, voltage $V_4$ can be higher than voltage $V_3$ applied to other unselected word lines. That is, $V_4 > V_3$. It can be understood that FIG. 8 merely provides an illustrative example, in which only two unselected word lines adjacent to the selected word line are considered in regard to voltage $V_4$, for the simplicity of description. In other examples, the higher pass voltage $V_4$ in the provided voltage scheme may be applied to more unselected word lines adjacent to the selected word lines, e.g., four unselected word lines including $W_{n-2}$, $W_{n-1}$, $W_{n+1}$, and $W_{n+2}$.

Figure 9:
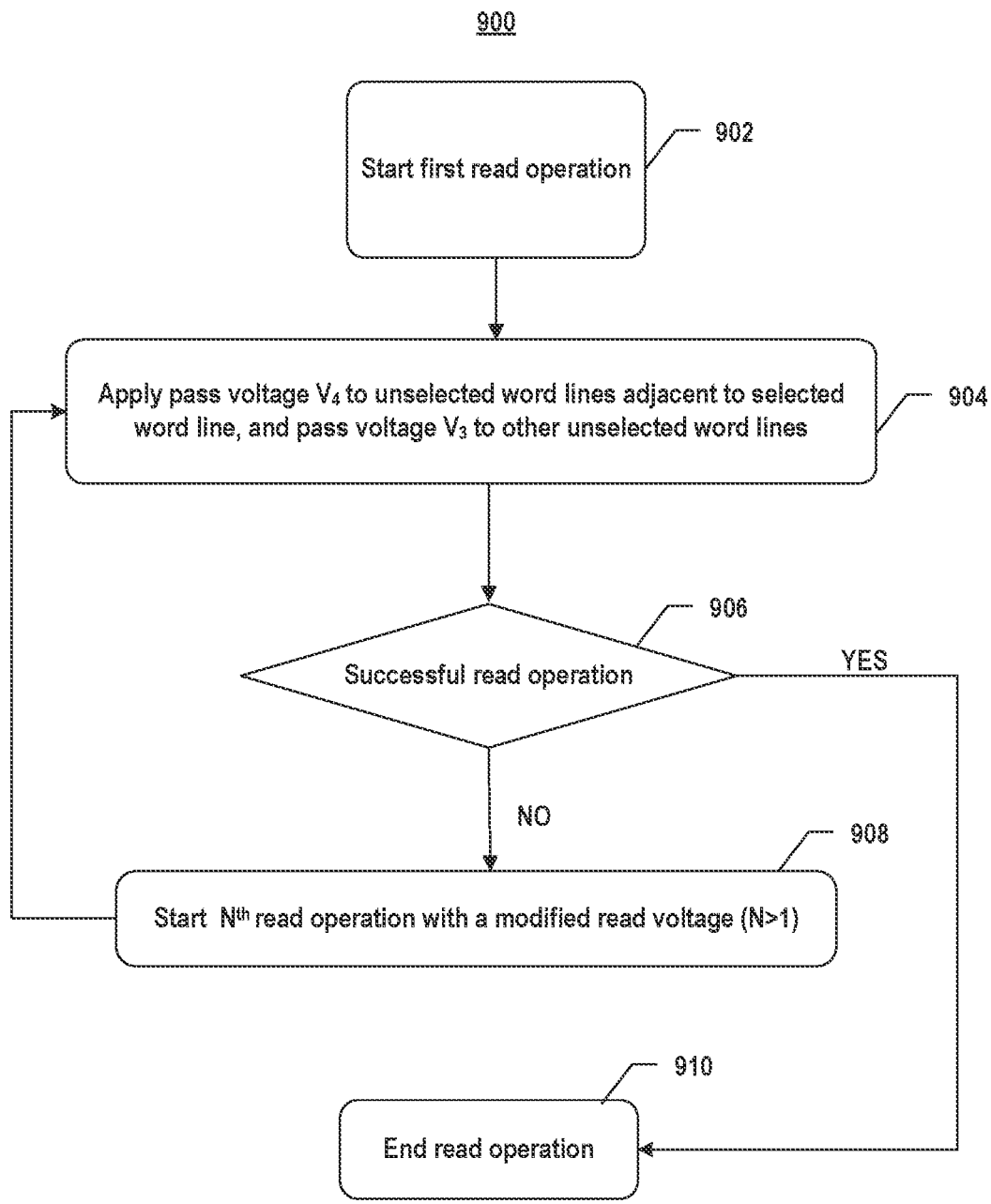
FIG. 9 illustrates a flow chart of an exemplary read operation method, according to some implementations of the present disclosure.

FIG. 9 illustrates a flow chart of an exemplary read operation method 900, according to some implementations of the present disclosure. As shown in FIG. 9, when preparing to perform a read operation on a memory cell at 902, a read voltage $V_{read}$ may be applied to a selected word line $WL_n$, corresponding to the memory cell. Method 900 may further proceed to 904. At 904, pass voltage $V_4$ may be applied to the unselected word lines (e.g., $WL_{n+1}$ and $WL_{n-1}$) that are adjacent to the selected word line, while pass voltage $V_3$ may be applied to other unselected word lines. Other parameters applied to the memory device may remain the same. At 906, in response to a successful read operation, the read operation on the memory cell, corresponding to the selected word line, may be ended at 910. On the contrary, in response to an unsuccessful read operation, a read retry may be triggered, and a second read operation may be started at 908.

As described above, in some examples, pass voltage $V_4$ may be higher than pass voltage $V_3$, i.e., $V_4 > V_3$. That is, method 900 in FIG. 9 may be proceeded according to the voltage scheme provided by FIG. 8. However, the present disclosure does not limit thereto. That is, consistent with the scope of the present disclosure, the same pass voltage may be applied to all the unselected word lines, either adjacent to the selected word line or not, in method 900. Namely, $V_4 = V_3$. Meanwhile, in the present disclosure, the terms "successful" and "unsuccessful" may be used to describe whether the read operation result has passed or has failed based on one or more criteria.

At the second read operation, read voltage $V_{read}$ may be modified, while pass voltage $V_4$, the same voltage as in the first read operation, may be applied to the unselected word lines adjacent to the selected word line (e.g., $WL_{n+1}$ and $WL_{n-1}$), and pass voltage $V_3$, the same voltage as in the first read operation, may be applied to the other unselected word lines. The term "modified" may refer to "increased" or "decreased." That is, read voltage $V_{read}$ may be increased or decreased in the second read operation, depending on the practical requirements.

In some implementations, if the second read operation has failed as well, a third read operation on the memory cell may be performed. At the third read operation, read voltage $V_{read}$ may be further modified, while pass voltage $V_4$, the same voltage in the second read operation, may be applied to the unselected word lines adjacent to the selected word line (e.g., $WL_{n+1}$ and $WL_{-1}$), and pass voltage $V_3$, the same voltage as in the second read option may be applied to the other unselected word lines. At the end of the third read operation, a read result may be determined.

In some implementations, when the third read operation has still failed, the above read process may be repeated until the read operation passes or read voltage $V_{read}$ applied to the selected word line has been modified and reaches a preset value. The preset value may be determined according to an actual application.

It is noted that, in the first read operation, the reading window is generally wide, and thus the tolerance for the reading disturbance may be relatively large. That is, even when a lower pass voltage is applied to the unselected word lines adjacent to the selected word line and causes the reading disturbance, due to the wider reading window, the resulting error bit count may not be apparent. As a result, there is no significant impact on the reading results at this read operation.

By contrast, in the second read operation or with more read operations, the reading windows may become narrower. Through increasing the pass voltage applied to the unselected word lines (e.g., $W_{n+1}$ and the channel potentials, corresponding to the intercell regions adjacent to the selected word line, may be enhanced (as depicted by the broken line in FIG. 3), thereby reducing the reading disturbances. Consequently, it can significantly help reduce the error bit count in the reading results.

Figure 10:
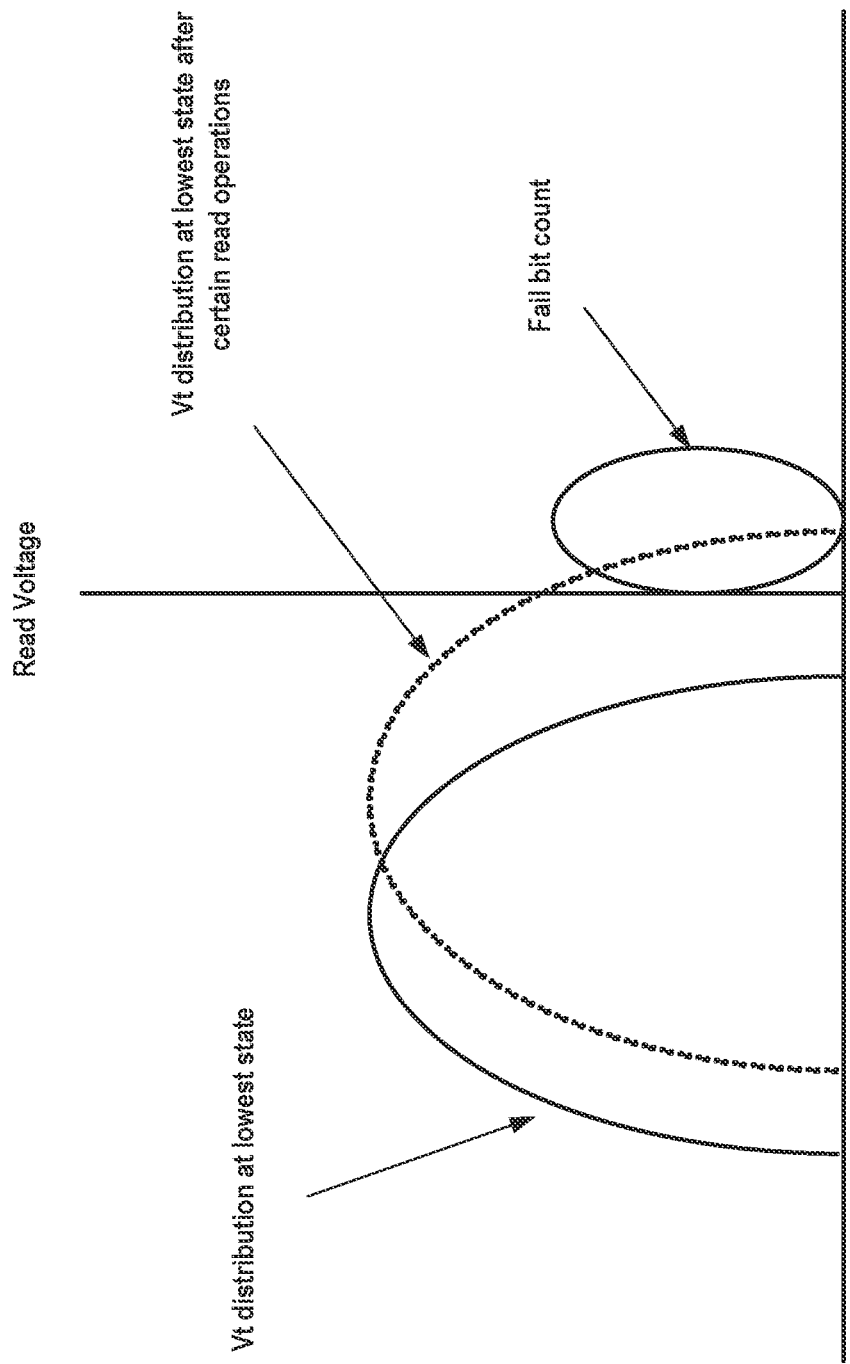
FIG. 10 illustrates a schematic diagram showing a drift of a threshold voltage distribution of the lowest state, resulting in a fail bit count.

In some implementations, pass voltage $V_4$ applied to the unselected word lines adjacent to the selected word line may be higher than voltage $V_3$ applied to the unselected word lines that are not adjacent to the selected word line in the first read operation. This may result that, after multiple repeats of the read operations on the selected word line, a threshold voltage of the lowest state may drift to a higher level, as shown in FIG. 10. In FIG. 10, the solid line may represent the threshold voltage of the lowest state before the drift, and the broken line may represent the threshold voltage of the lowest state after the drift. Due to the threshold voltage drift, an increasing-level read disturbance may impact the unselected word lines adjacent to the selected word line, resulting in error bit data.

It is also noted that when a small amount of error bit data appears in the memory device, the error checking correction (ECC) mechanism of the memory device may still be able to correct the error bit data. When a fail bit count (FBC) exceeds the capability of the ECC mechanism, however, the read operation may fail.

In view of the above observations, the present disclosure provides another read operation scheme. In some implementations, during the read retry operations, the read voltage to the selected word line can be modified, and in the first read operation, the pass voltage applied to all the unselected word lines may remain the same. In the following one or more read retries, the pass voltage applied to the unselected word lines adjacent to the selected word lines may be increased. As a result, the channel potentials corresponding to the intercell regions adjacent to the selected word line can still be enhanced.

Figure 11:
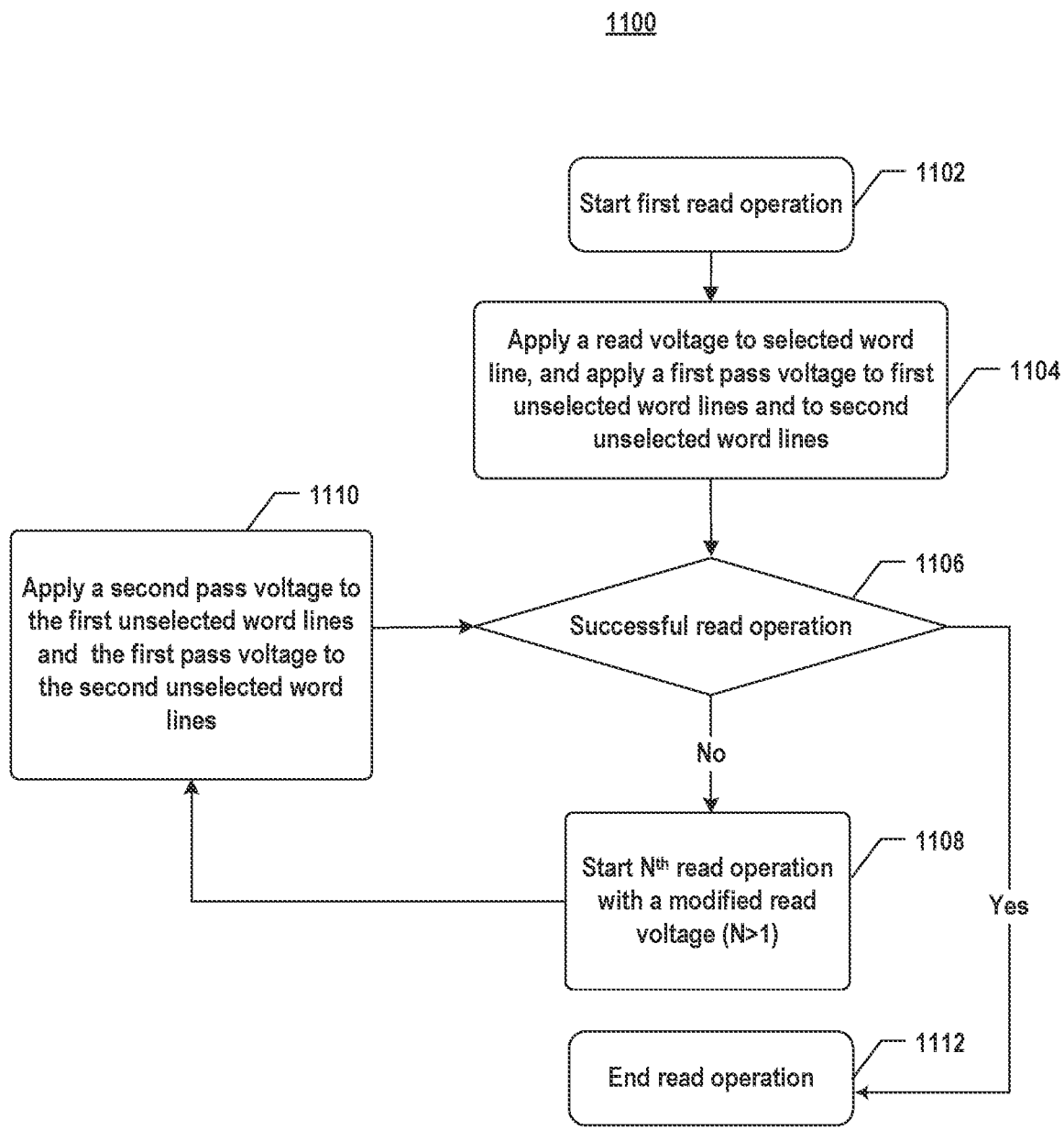
FIG. 11 illustrates a flow chart of another explementary read operation method, according to some implementations of the present disclosure.

FIG. 11 illustrates a flow chart of another explementary read operation method 1100, according to some implementations of the present disclosure. Method 1100 may proceed to 1102. At 1102, upon receiving a read instruction signal from memory controller 406, the first read operation on a memory cell may be started. At 1104, a first read voltage $V_{read1}$ may be applied to the selected word line, and the same pass voltage, a first pass voltage, may be applied to both groups of first unselected word lines and second unselected word lines. First read voltage $V_{read1}$ applied here in FIG. 11 may be identical or different from voltage $V_{read}$ applied in FIG. 9.

In the process of performing a read operation, the special memory cells corresponding to special word lines that include the string selection line SSL, the ground selection line GSL, and the dummy word lines are not configured for storing data. Therefore, it can be understood that the term "unselected word lines" does not include these special word lines. These unselected word lines may be categorized into two groups, i.e., the first unselected word lines and the second unselected word lines. The term "first unselected word lines" may be used to indicate one or more unselected word lines adjacent to the selected word line. The "second unselected word lines" may be used to describe the remaining or the other unselected word lines, by excluding the first unselected word lines and those special word lines.

For example, the term "first unselected word lines" may refer to the two unselected word lines $WL_{n+1}$ and $WL_{n-1}$ adjacent to the selected word line. In another example, the term "first unselected word lines" may refer to the two unselected word lines $WL_{n+1}$ and $WL_{-1}$ directly next to the selected word line and the other two unselected word lines $WL_{n+2}$ and $WL_{n-2}$ not directly next to but close to the selected word line. In other words, the term "adjacent to" used herein may not only describe one or more unselected word lines directly next to the selected word line, but also possibly those unselected word lines close to the selected word lines. That means, in still another example, the term "first unselected word lines" may possibly refer to the six unselected word lines $WL_{n+3}$, $WL_{n+2}$, $WL_{n-1}$, $WL_{n-2}$, and $WL_{n-3}$ adjacent to the selected word line. It can be understood that the chosen number of the first unselected word lines adjacent to the selected word line may depend on the levels of channel potentials corresponding to the intercell region(s) adjacent to the selected word line. On the other hand, the term "second unselected word lines" may be used to indicate the other unselected word lines. In order to reduce the threshold voltage drift depicted in FIG. 10, the same pass voltage may be applied to the unselected word lines adjacent to the selected word line and the other unselected word lines in the first read operation.

Based on the first read result of the first read operation, it may be determined whether the first read operation on the memory cell is successful or not, at 1106. In some implementations, an error bit count of the first read result may be compared to a maximum value defined by a memory error detection and correction algorithm. In one example, in response to the error bit count of the first read result being less than the maximum value, it may be determined that the first read operation is successful at 1106. When the first read operation is successful, method 1100 may end the read operation on the memory cell, corresponding to the selected word line, at 1112. In some instances, memory controller 406 may further instruct to proceed with a read operation on another memory cell.

On the contrary, in response to the error bit count of the first read result being greater than or equal to the maximum value of the memory error detection and correction algorithm, it may be determined that the first read operation is unsuccessful or has failed. In response to an unsuccessful read operation, a read retry, by performing a second read option, may be triggered. In the second read operation, a second read voltage $V_{read2}$ may be applied to the selected word line at 1108. In some implementations, second read voltage $V_{read2}$ in the second read operation may be different from first read voltage $V_{read1}$ in the first read operation. That is, second read voltage $V_{read2}$ may be higher than or lower than first read voltage $V_{read1}$, depending on practical requirements.

As described, it can be understood that when a small amount of error bit data appears, the error checking correction (ECC) mechanism of the memory device may still be able to correct the fail bit data. However, when the fail bit count (FBC) exceeds the capability of the ECC mechanism, the read operation on the memory cell may be recognized as having failed. For that reason, a successful first read operation or a pass of the first read operation may be interpreted as no error bit data associated with the read-out data of the first read operation or a relatively small amount of error bit data. In the latter case, the ECC mechanism of the memory device may be able to correct the small-level errors.

At 1110, a second pass voltage may be applied to the first unselected word lines, while the first pass voltage may be applied to the second unselected word lines. In some implementations, the second pass voltage may be higher than the first pass voltage. Namely, the pass voltage applied to the first unselected word lines can be increased, and the same pass voltage, as in the first read operation, may be applied to the second unselected word lines, at 1110. Overall, in the second read operation, the read voltage may be modified at 1108, and the pass voltage applied to the first unselected word lines may be increased at 1110. However, the present disclosure does not limit thereto. In other words, in other implementations, the same pass voltage can be applied to all the unselected word lines both in the first and second read operations.

In some instances, other parameters applied to the memory device may remain the same. The first pass voltage was the voltage applied to both groups of the first unselected word lines and the second unselected word lines in the first read operation. As defined above, the term "first unselected word lines" may refer to the one or more unselected word lines adjacent to the selected word line, and the term "second unselected word lines" may refer to the other unselected word lines.

It may be further determined whether the second read operation on the memory cell is successful according to a second read result of the second read operation. Likewise, an error bit count of the second read result may be compared to the maximum value defined by the memory error detection and correction algorithm. In one example, in response to the error bit count of the second read result being less than the maximum value, it may be determined that the second read operation is successful at 1106. When the second read operation is successful, method 1100 may end the read operation on the memory cell corresponding to the selected word line. On the contrary, in response to the error bit count of the second read result being greater than or equal to the maximum value of the memory error detection and correction algorithm, it may be determined that the second read operation is unsuccessful or has failed. Upon a failure of the second read operation, a read retry may be triggered, and a third read operation may be performed.

In some implementations, in the third read operation, through again modifying the read voltage applied to the selected word line and, e.g., increasing the pass voltage applied to the unselected word lines adjacent to the selected word line, the channel potentials corresponding to the intercell regions adjacent to the selected word line may be further enhanced. Accordingly, the read disturbances can be reduced, thereby improving the reliability of the memory device.

In some implementations, the loop in method 1100, from 1106 to 1110, may be repeated. Generally speaking, upon determining that an $N^{th}$ read operation has failed, the peripheral circuits may be configured to start an $N+1^{th}$ read operation, where N is a positive integer and greater than 2. In the $N+1^{th}$ read operation, the peripheral circuits may be further configured to apply an $N+1^{th}$ pass voltage to the first unselected word lines and the first pass voltage to the second unselected word lines. An $N^{th}$ pass voltage was applied to the first unselected word lines in the $N^{th}$ read operation. In some implementations, the $N+1^{th}$ pass voltage may be higher than each of the $N^{th}$ pass voltage, the first pass voltage, and the second pass voltage, but the present disclosure does not limit thereto.

In some other implementations, in the multiple read retries, the read voltage applied to the selected word line may be modified multiple times, whereas the pass voltage applied to the first unselected word lines adjacent to the selected word line may be increased only once. Through this manner, the channel potentials corresponding to the intercell regions adjacent to the selected word line may still be enhanced, but at the same time, the frequency that the stored data is subjected to a higher pass voltage during a storage cycle can be reduced, thus increasing the reliability of the memory device.

Figure 12:
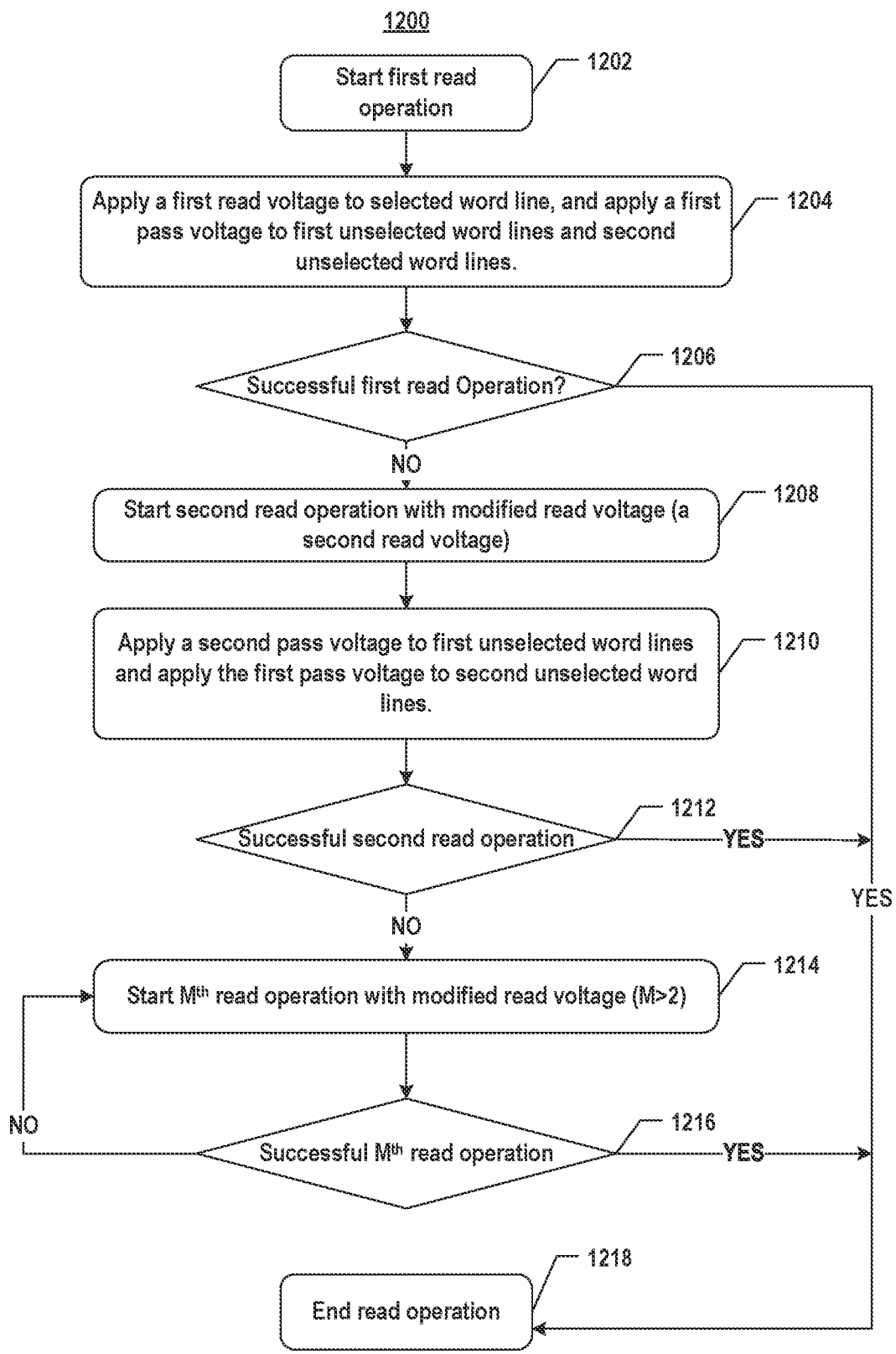
FIG. 12 illustrates a flow chart of still another explementary read option method, according to some implementations of the present disclosure.

FIG. 12 illustrates a flow chart of still another explementary read operation method 1200, according to some implementations of the present disclosure. Method 1200 may first proceed to 1202. At 1202, upon receiving a read instruction signal from memory controller 406, a first read operation on a memory cell may be started. At 1204, a first read voltage $V_{read1}$ may be applied to a selected word line, and a first pass voltage $V_{pass1}$ may be applied to both groups of the first unselected word lines and the second unselected word lines. As described above, the term "first unselected word lines" herein may be used to describe the unselected word lines adjacent to the selected word line (e.g., $WL_{n+1}$ and $WL_{n-1}$), while the term "second unselected word lines" may be used to describe the other unselected word lines. It can also be understood that although the voltages in FIG. 12 are numbered, such as the "first" read voltage or the "second" pass voltage, they may not be identical to those annotated in FIG. 11.

Based on the first read result of the first read operation, it may be determined whether the first read operation is successful. In one example, an error bit count of the first read result may be compared to a maximum value defined by a memory error detection and correction algorithm. In one example, in response to the error bit count of the first read result being less than the maximum value, it may be determined that the first read operation is successful at 1206. When the first read operation is successful, method 1200 may end the read operation on the memory cell, corresponding to the selected word line, at 1218.

On the contrary, in response to the error bit count of the first read result being greater than or equal to the maximum value of the memory error detection and correction algorithm, it may be determined that the first read operation is unsuccessful or has failed. In response to an unsuccessful read operation, a read retry may be triggered, and a second read operation may be started. In the second read operation, a second read voltage $V_{read2}$ may be applied to the selected word line at 1208. In some implementations, the second read voltage $V_{read2}$ applied to the selected word line in the second read operation may be different from the first read voltage $V_{read1}$ in the first read operation. That is, second read voltage $V_{read2}$ may be higher than or lower than first read voltage $V_{read1}$, depending on practical requirements.

Meanwhile, the voltage applied to the first unselected word lines may be increased, while the same voltage may be applied to the second unselected word lines. More specifically, a second pass voltage may be applied to the first unselected word lines, and a first pass voltage may be applied to the second unselected word lines. In some implementations, the second pass voltage may be higher than the first pass voltage that was the voltage applied to all the unselected word lines in the first read operation. Similarly, the term "first unselected word lines" may refer to the one or more unselected word lines adjacent to the selected word line, and the term "second unselected word lines" may refer to the other unselected word lines. The number of the first unselected word line is not limited in the present disclosure. Generally speaking, in the second read operation of method 1200, the read voltage may be modified at 1208, and the pass voltage applied to the first unselected word lines may be increased at 1210.

Likewise, it may be determined whether the second read operation is successful according to a second read result of the second read operation. In some implementations, an error bit count of the second read result may be compared to a maximum value defined by a memory error detection and correction algorithm. In one example, in response to the error bit count of the second read result being less than the maximum value, it may be determined that the second read operation is successful at 1212. When the second read operation is successful, method 1200 may end the read operation on the memory cell, corresponding to the selected word line, at 1218. On the contrary, in response to the error bit count of the second read result being greater than or equal to the maximum value of the memory error detection and correction algorithm, it may be determined that the second read operation is unsuccessful or has failed. Upon a failure of the second read operation, a read retry may be triggered, and a third read operation may be performed at 1214.

In the third read operation, the read voltage applied to the selected word line may be further modified, whereas the pass voltage applied to the first unselected word lines may remain the same, as in the second read operation, to be the second pass voltage and the pass voltage applied to the second unselected word lines may remain the same, as in the second read operation, to be the first pass voltage, at 1214. Method 1200 may further proceed to 1216. At 1216, it may be determined whether the third read operation is successful according to a third read result of the third read operation. In some implementations, in response to the error bit count of the third read result being less than the maximum value of the memory error detection and correction algorithm, it may be determined that the third read operation is successful at 1216. The read operation on the memory cell may be ended at 1218. On the contrary, in response to the error bit count of the third read result being greater than or equal to the maximum value, it may be determined that the third read operation is unsuccessful or has failed. In some implementations, in response to a failure of a read operation after the second read operation, a read retry with a modified read voltage may be applied to the selected word line, without further changing the pass voltage applied to the unselected word lines, at 1214. That is, in the third read option of some implementations, the second pass voltage may be applied to the first unselected word lines, and the first pass voltage may be applied to the second unselected word lines. Upon a successful read result, the read operation on the memory cell may be ended.

It can be understood that FIG. 12 merely provides an illustrative example consistent with the scope of the present disclosure. In other implementations, M annotated in FIG. 12 may be a different positive integer other than 2, for example, 3. That is, in the third read operation (as well as the second read operation), the pass voltage applied to the first unselected word lines may also be increased.

In view of the above, in the second read operation, the read voltage applied to the selected word line may be modified, and the pass voltage applied to the unselected word lines adjacent to the selected word line may also be increased. In the following read operations, only the read voltage applied to the selected word line may be modified, but the pass voltage applied to the unselected word lines adjacent to the selected word line may not be changed, thereby enhancing the channel potentials corresponding to the intercell regions adjacent to the selected word line. Meanwhile, the frequency that the stored data is subjected to a higher pass voltage during a storage cycle may be reduced, thus improving the reliability of the memory device.

In another aspect, the present disclosure provides a memory device that may include a memory cell array and peripheral circuits. FIGS. 6 and 7 show some exemplary memory devices, according to some implementations of the present disclosure. The peripheral circuits may be configured to, in response to the failure of the first read operation, perform the second read operation. In some implementations, during performing the second read operation, the peripheral circuits may be configured to apply the second pass voltage to the first unselected word lines and apply the first pass voltage to the second unselected word lines. In some implementations, the peripheral circuits may include control logic 712, voltage generator 710, and row decoder/WL driver 708, as shown in FIG. 7. Voltage generator 710 may be configured to generate and convey the required voltage potentials to memory cell array 702. In some implementations, the second pass voltage may be higher than the first pass voltage. The first pass voltage may be the voltage that was applied to both groups of the first unselected word lines and the second unselected word lines in the first read operation.

In some implementations, control logic 712 may generate a command signal in response to determining that the first read operation has failed. In response to the command signal, voltage generator 710 may generate the first pass voltage and the second pass voltage. Row decoder/WL driver 708 may, in response to the command signal, apply the second pass voltage to the first unselected word lines and apply the first pass voltage to the second unselected word lines.

More specifically, in the process of performing the first read operation, control logic 712 may generate the command signal upon determining that the first read operation has failed. The command signal may be configured to instruct the memory device to perform the second read operation. In some implementations, upon receipt of the command signal, voltage generator 710 may generate the first pass voltage and the second pass voltage according to the command signal. Upon receipt of the command signal, row decoder/WL driver 708 may apply a reading pulse corresponding to the read voltage to the selected word line and apply the first pass voltage or the second pass voltage to the unselected word lines. In some implementations, a power supply potential may be applied to the string selection line SSL, and a ground potential may be applied to the source line SL. Through voltage generator 710, the first pass voltage and the second pass voltage may be generated. Further, through row decoder/WL driver 708, the second pass voltage may be applied to the first unselected word lines, and the first pass voltage may be applied to the second unselected word lines.

In some implementations, the peripheral circuits may be further configured to, in the process of performing the second read operation, apply the second read voltage to the selected word line. The second read voltage may be different from the first read voltage. The first read voltage was the voltage applied to the selected word line in the first read operation.

More specifically, in the process of performing the read operations, voltage generator 710 may be configured to generate the first read voltage, the second read voltage, and so on. Further, row decoder/WL driver 708 may be configured to apply a reading pulse corresponding to the first and second read voltages. In one example, during the second read operation, voltage generator 710 may generate the second read voltage and through row decoder/WL driver 708, apply the second read voltage to the selected word line. Similarly, during the first read operation, voltage generator 710 may also generate the first read voltage and through row decoder/WL driver 708, apply the first read voltage to the selected word line. In other words, voltage generator 710 may generate these read voltages and pass voltages. In some implementations, the peripheral circuits may also be configured to store multiple read voltages and multiple pass voltages and generate corresponding relations between the number of applied read operations and applied voltages.

In some implementations, the peripheral circuits may include cache/registers 714 configured to store a first voltage configuration table and a second voltage configuration table. The first voltage configuration table may be configured to store a corresponding relation between the number of applied read operations and the pass voltages. The second voltage configuration table may be configured to store another corresponding relation between the number of applied read operations and the read voltages. In some implementations, the peripheral circuits may be further configured to retrieve a pass voltage, corresponding to the number of applied read operations, which can be applied to the first unselected word lines through querying the first voltage configuration table. In some implementations, the peripheral circuits may also be configured to retrieve a read voltage, corresponding to the number of applied read operations, which can be applied to the selected word line through querying the second voltage configuration table. Through querying the first voltage configuration table and/or the second voltage configuration table, it becomes convenient and prompt to determine at least one of the pass voltage or the read voltage.

It can be understood that cache/registers 714 may include a small storage region in the memory device configured to temporarily store data involved in some operations and/or results of the operations. In some implementations, cache/registers 714 may be understood as a commonly used timing logic circuit merely with a memory circuit. The memory circuit of cache/registers 714 may include one or more latches or triggers.

In some implementations, the peripheral circuits may, upon determining that the second read operation has failed, perform the third read operation. During the process of the third read operation, the third read voltage may be applied to the selected word line, while the second pass voltage may be applied to the first unselected word lines, and the first pass voltage may be applied to the second unselected word lines. The third read voltage may be different from the first read voltage or the second read voltage, and the second pass voltage may be higher than the first pass voltage.

In other implementations, the peripheral circuits may, upon determining that the second read operation has failed, perform the third read operation. During the process of the third read operation, the third read voltage may be applied to the selected word line, while the third pass voltage may be applied to the first unselected word lines, and the first pass voltage may be applied to the second unselected word line. The third read voltage may be different from the first read voltage or the second read voltage, and the third pass voltage may be higher than the first pass voltage.

In some implementations, the peripheral circuits may be further configured to perform the first read operation. During the process of performing the first read operation, the first read voltage may be applied to the selected word line. The first pass voltage may be applied to the first unselected word lines and the second unselected word lines.

In some implementations, the peripheral circuits may, in response to the error bit count of the first read result being greater than the maximum value defined by the memory error detection and correction algorithm, determine that the first read operation has failed.

In some implementations, the memory device may include, e.g., a three-dimensional (3D) NAND memory device, as shown in FIG. 6.

In still another aspect, the present disclosure further provides a memory system. The memory system may include a memory controller and one or more of the memory devices as described above in any of the implementations, as shown in FIG. 4. The memory controller may be coupled with the one or more memory devices. In some implementations, the memory system may include a solid-state device (SSD), as shown in FIG. 5B, but the present disclosure does not limit thereto.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations but should be defined only in accordance with the following claims and their equivalents.

What is claimed is:

1. A memory device, comprising:
  a plurality of memory cells arranged in one or more memory blocks, each memory block comprising an array that comprises rows of memory cells; and
  peripheral circuits coupled to the plurality of memory cells, comprising a control logic, and configured to:
    select, through the control logic, a memory block from the one or more memory blocks and select, through the control logic, a word line of the memory block corresponding to a target memory cell of the plurality of memory cells to be read, each memory cell in a same row of the array with the target memory cell being coupled to the selected word line;
    in a first read operation, apply a first read voltage to the selected word line and a first pass voltage to each of unselected word lines, wherein the selected word line corresponds to the target memory cell to be read, and the unselected word lines comprise first unselected word lines comprising one or more word lines adjacent to the selected word line, and second unselected word lines comprising remaining unselected word lines;
    upon determining that the first read operation on the target memory cell has failed as a failed first read operation, start a second read operation on the target memory cell;
    in the second read operation upon determining that the first read operation has failed, during a first time period after the failed first read operation, apply a second pass voltage to the first unselected word lines each coupling each memory cell in a same row of the array with a corresponding first unselected word line; and
    in the second read operation upon determining that the first read operation has failed, during the first time period after the failed first read operation, apply the first pass voltage that was previously applied in the failed first read operation to the second unselected word lines,
    wherein the second pass voltage is higher than the first pass voltage.

2. The memory device of claim 1, wherein the peripheral circuits are further configured to:
  in the second read operation, apply a second read voltage to the selected word line, the second read voltage being different from the first read voltage applied to the selected word line in the first read operation.

3. The memory device of claim 2, wherein the peripheral circuits are further configured to:
  upon determining that the second read operation has failed, start a third read operation on the target memory cell; and
  in the third read operation, apply the second pass voltage to the first unselected word lines, the first pass voltage to the second unselected word lines, and a third read voltage to the selected word line, the third read voltage being different from each of the first read voltage and the second read voltage.

4. The memory device of claim 1, wherein the peripheral circuits are further configured to:
  upon determining that the second read operation has failed, start a third read operation on the target memory cell; and
  in the third read operation, apply a third pass voltage to the first unselected word lines and the first pass voltage to the second unselected word lines, the third pass voltage being higher than the second pass voltage.

5. The memory device of claim 1, wherein the peripheral circuits are further configured to:
  in response to an error bit count of the first read operation being greater than or equal to a threshold number, determine that the first read operation has failed.

6. The memory device of claim 1, wherein the peripheral circuits are further configured to perform at least one of:
  querying a first voltage configuration table to retrieve a pass voltage corresponding to a number of applied read operations, the first voltage configuration table being configured to store a first corresponding relation between multiple pass voltages and numbers of applied read operations, and the pass voltage being applied to the first unselected word lines; or
  querying a second voltage configuration table to retrieve a read voltage corresponding to the number of applied read operations, the second voltage configuration table being configured to store a second corresponding relation between multiple read voltages and the numbers of applied read operations, and the read voltage being applied to the selected word line.

7. The memory device of claim 1, wherein the memory device is a three-dimensional (3D) NAND memory device.

8. The memory device of claim 1, wherein:
  from the failed first read operation to the second read operation after the failed first read operation, a voltage on the first unselected word lines increases from the first pass voltage to the second pass voltage, and another voltage on the selected word line changes from the first read voltage to a second read voltage.

9. A memory system, comprising:
  one or more memory devices, each comprising:
    a plurality of memory cells arranged in one or more memory blocks, each memory block comprising an array that comprises rows of memory cells; and peripheral circuits coupled to the plurality of memory cells and comprising a control logic; and a memory controller coupled to the one or more memory devices and configured to send a read instruction signal to one of the one or more memory devices, wherein in response to the read instruction signal from the memory controller, the peripheral circuits of a corresponding memory device are configured to:

select, through the control logic, a memory block from the one or more memory blocks in the corresponding memory device and select, through the control logic, a word line of the memory block corresponding to a target memory cell of the plurality of memory cells to be read, each memory cell in a same row of the array with the target memory cell being coupled to the selected word line;

in a first read operation, apply a first read voltage to the selected word line and a first pass voltage to each of unselected word lines, wherein the selected word line corresponds to the target memory cell to be read, and the unselected word lines comprise first unselected word lines comprising one or more word lines adjacent to the selected word line, and second unselected word lines comprising remaining unselected word lines;

upon determining that the first read operation on the target memory cell has failed as a failed first read operation, start a second read operation on the target memory cell;

in the second read operation upon determining that the first read operation has failed, during a first time period after the failed first read operation, apply a second pass voltage to the first unselected word lines each coupling each memory cell in a same row of the array with a corresponding first unselected word line; and in the second read operation upon determining that the first read operation has failed, during the first time period after the failed first read operation, apply the first pass voltage that was previously applied in the failed first read operation to the second unselected word lines, wherein the second pass voltage is higher than the first pass voltage.

10. The memory system of claim 9, wherein the peripheral circuits are further configured to:

upon determining that an $N^{th}$ read operation has failed, start an $N+1^{th}$ read operation on the target memory cell, N being a positive integer and greater than 0; and in the $N+1^{th}$ read operation, apply an $N+1^{th}$ pass voltage to the first unselected word lines and the first pass voltage to the second unselected word lines, wherein:

an $N^{th}$ pass voltage was applied to the first unselected word lines in the $N^{th}$ read operation; and the $N+1^{th}$ pass voltage is higher than the $N^{th}$ pass voltage.

11. The memory system of claim 9, wherein the peripheral circuits are further configured to:

upon determining that the second read operation has failed, start a third read operation on the target memory cell; and in the third read operation, apply a third read voltage to the selected word line, the third read voltage being different from each of the first read voltage and a second read voltage, and the second read voltage comprising a second voltage applied to the selected word line in the second read operation.

12. The memory system of claim 9, wherein:

the peripheral circuits further comprise a voltage generator and a word line driver;

the control logic is configured to generate a command signal upon determining that the first read operation has failed;

the voltage generator is configured to generate the first pass voltage and the second pass voltage in response to the command signal; and the word line driver is configured to apply the second pass voltage to the first unselected word lines and the first pass voltage to the second unselected word lines.

13. A method for read operations on a memory device that comprises a plurality of memory cells arranged in one or more memory blocks, each memory block comprising an array that comprises rows of memory cells, the method comprising:

selecting a memory block from the one or more memory blocks and selecting a word line of the memory block corresponding to a target memory cell of the plurality of memory cells to be read, each memory cell in a same row of the array with the target memory cell being coupled to the selected word line;

in a first read operation, applying a first read voltage to the selected word line and a first pass voltage to each of unselected word lines, wherein the selected word line corresponds to the target memory cell to be read, and the unselected word lines comprise first unselected word lines comprising one or more word lines adjacent to the selected word line, and second unselected word lines comprising remaining unselected word lines;

upon determining that the first read operation on the target memory cell has failed as a failed first read operation, starting a second read operation on the target memory cell;

in the second read operation upon determining that the first read operation has failed, during a first time period after the failed first read operation, applying a second pass voltage to the first unselected word lines each coupling each memory cell in a same row of the array with a corresponding first unselected word line; and in the second read operation upon determining that the first read operation has failed, during the first time period after the failed first read operation, applying the first pass voltage that was previously applied in the failed first read operation to the second unselected word lines, wherein the second pass voltage is higher than the first pass voltage.

14. The method of claim 13, further comprising:

in the second read operation, applying a second read voltage to the selected word line, the second read voltage being different from the first read voltage applied to the selected word line in the first read operation.

15. The method of claim 13, further comprising:

upon determining that the second read operation has failed, starting a third read operation on the target memory cell; and in the third read operation, applying a third read voltage to the selected word lines, the third read voltage being different from each of the first read voltage and a second read voltage, and the second read voltage comprising a second voltage that was applied to the selected word line in the second read operation.

16. The method of claim 13, further comprising:
upon determining that the second read operation has failed, start a third read operation on the target memory cell; and
in the third read operation, applying the second pass voltage to the first unselected word lines, the first pass voltage to the second unselected word lines, and a third read voltage to the selected word line, the third read voltage being different from each of the first read voltage and a second read voltage, and the second read voltage comprising a second voltage that was applied to the selected word line in the second read operation.

17. The method of claim 13, further comprising:
upon determining that the second read operation has failed, starting a third read operation on the target memory cell; and
in the third read operation, applying a third pass voltage to the first unselected word lines and the first pass voltage to the second unselected word lines, the third pass voltage being higher than each of the first pass voltage and the second pass voltage.

18. The method of claim 13, further comprising:
in response to an error bit count of the first read operation being greater than or equal to a threshold number, determining that the first read operation has failed.

19. The method of claim 13, further comprising at least one of:
querying a first voltage configuration table to retrieve a pass voltage corresponding to a number of applied read operations, the first voltage configuration table being configured to store a first corresponding relation between multiple pass voltages and numbers of applied read operations, and the pass voltage being applied to the first unselected word lines; or
querying a second voltage configuration table to retrieve a read voltage corresponding to the number of applied read operations, the second voltage configuration table being configured to store a second corresponding relation between multiple read voltages and the numbers of applied read operations, and the read voltage being applied to the selected word line.

20. The method of claim 13, wherein applying the second pass voltage to the first unselected word lines and the first pass voltage to the second unselected word lines comprises:
generating a command signal upon determining that the first read operation has failed;
generating the first pass voltage and the second pass voltage in response to the command signal; and
applying the second pass voltage to the first unselected word lines and the first pass voltage to the second unselected word lines.

* * * * *